United States Patent
Joe et al.

(10) Patent No.: US 10,614,886 B2
(45) Date of Patent: Apr. 7, 2020

(54) NONVOLATILE MEMORY DEVICE AND A METHOD OF PROGRAMMING THE NONVOLATILE MEMORY DEVICE

(71) Applicant: SAMSUNG ELECTRONICS CO., LTD., Suwon-si, Gyeonggi-Do (KR)

(72) Inventors: Sung-min Joe, Seoul (KR); Seung-Jae Lee, Hwaseong-si (KR); Sun-gun Lee, Daegu (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/135,213

(22) Filed: Sep. 19, 2018

(65) Prior Publication Data
US 2019/0096488 A1    Mar. 28, 2019

Related U.S. Application Data

(60) Provisional application No. 62/561,845, filed on Sep. 22, 2017.

(30) Foreign Application Priority Data

Jan. 25, 2018  (KR) .......................... 10-2018-0009604

(51) Int. Cl.
| G11C 7/04 | (2006.01) |
| G11C 16/04 | (2006.01) |
| G11C 16/10 | (2006.01) |
| G11C 16/08 | (2006.01) |
| G11C 16/34 | (2006.01) |
| G11C 16/32 | (2006.01) |

(Continued)

(52) U.S. Cl.
CPC .......... *G11C 16/10* (2013.01); *G11C 11/5628* (2013.01); *G11C 16/08* (2013.01); *G11C 16/32* (2013.01); *G11C 16/3459* (2013.01); *G11C 8/14* (2013.01); *G11C 2211/5648* (2013.01); *H01L 27/11582* (2013.01)

(58) Field of Classification Search
CPC ..... G11C 16/0483; G11C 16/26; G11C 16/10; G11C 16/08; G11C 16/3459; G11C 8/12; G11C 7/04; G11C 16/34; G11C 7/22
See application file for complete search history.

(56) References Cited

U.S. PATENT DOCUMENTS

| 6,781,877 B2 | 8/2004 | Cernea et al. |
| 7,505,312 B2 | 3/2009 | Matsunaga et al. |

(Continued)

FOREIGN PATENT DOCUMENTS

JP      2010-108541      5/2010

*Primary Examiner* — Hien N Nguyen
(74) *Attorney, Agent, or Firm* — F. Chau & Associates, LLC

(57) ABSTRACT

A method of programming a non-volatile memory device including a first memory block and a second memory block includes: performing a first program operation on a first memory cell in the first memory block and connected to a first word line of a first level with respect to a substrate; after the performing of the first program operation on the first memory cell, performing the first program operation on a second memory cell in the second memory block and connected to a second word line of the first level; and after the performing of the first program operation on the second memory cell, performing a second program operation on the first memory cell.

20 Claims, 32 Drawing Sheets

(51) Int. Cl.
    *G11C 11/56*     (2006.01)
    *H01L 27/11582*     (2017.01)
    *G11C 8/14*     (2006.01)

(56) References Cited

U.S. PATENT DOCUMENTS

| | | |
|---|---|---|
| 7,804,712 B2 | 9/2010 | Kim et al. |
| 8,130,552 B2 | 3/2012 | Miwa et al. |
| 8,301,850 B2 | 10/2012 | Kawano et al. |
| 8,472,280 B2 | 6/2013 | Li |
| 8,811,080 B2 | 8/2014 | Kim et al. |
| 9,378,823 B2 | 6/2016 | Tanzawa |
| 9,928,126 B1 * | 3/2018 | Shappir ............... G11C 11/5642 |
| 2010/0042777 A1 * | 2/2010 | Tsuji ............... G06K 19/07732 |
| | | 711/103 |
| 2015/0046770 A1 * | 2/2015 | Luo ................ G11C 29/12005 |
| | | 714/764 |
| 2018/0342305 A1 * | 11/2018 | Cha .................... G11C 11/5642 |
| 2019/0035443 A1 * | 1/2019 | Park ..................... G11C 7/227 |

* cited by examiner

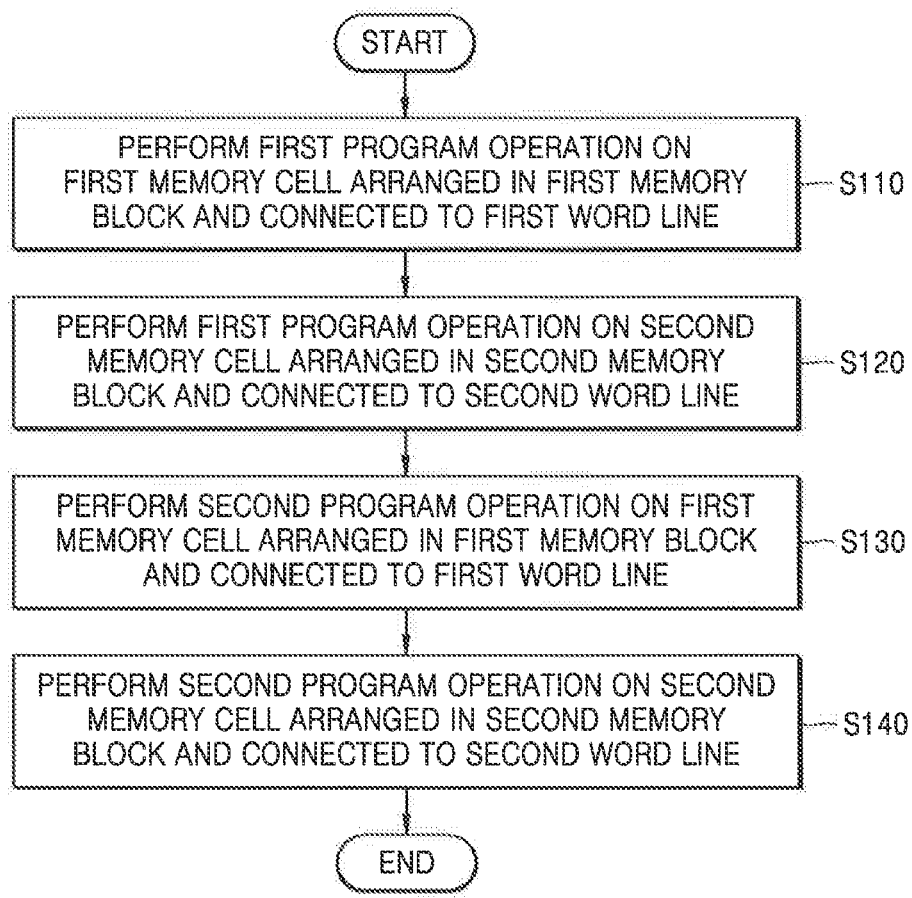

FIG. 19

| SCRAMBLE#1 | | BLKa | | | | BLKb | | | |
|---|---|---|---|---|---|---|---|---|---|
| | | SSL1a | SSL2a | SSL3a | SSL4a | SSL1b | SSL2b | SSL3b | SSL4b |
| WL8 | PGM1 | 1 | 3 | 5 | 7 | 2 | 4 | 6 | 8 |
| | PGM2 | 17 | 19 | 21 | 23 | 18 | 20 | 22 | 24 |
| WL7 | PGM1 | 9 | 11 | 13 | 15 | 10 | 12 | 14 | 16 |
| | PGM2 | 33 | 35 | 37 | 39 | 34 | 36 | 38 | 40 |
| WL6 | PGM1 | 25 | 27 | 29 | 31 | 26 | 28 | 30 | 32 |
| | PGM2 | | | | | | | | |

T2B PGM

FIG. 21

| SCRAMBLE#1 | | BLKa | | | | BLKb | | | |
|---|---|---|---|---|---|---|---|---|---|
| | | SSL1a | SSL2a | SSL3a | SSL4a | SSL1b | SSL2b | SSL3b | SSL4b |
| WL3 | PGM1 | 25 | 27 | 29 | 31 | 26 | 28 | 30 | 32 |
| | PGM2 | | | | | | | | |
| WL2 | PGM1 | 9 | 11 | 13 | 15 | 10 | 12 | 14 | 16 |
| | PGM2 | 33 | 35 | 37 | 39 | 34 | 36 | 38 | 40 |
| WL1 | PGM1 | 1 | 3 | 5 | 7 | 2 | 4 | 6 | 8 |
| | PGM2 | 17 | 19 | 21 | 23 | 18 | 20 | 22 | 24 |

B2T PGM

FIG. 23

| SCRAMBLE#2 | | BLKa | | | | BLKb | | | |
|---|---|---|---|---|---|---|---|---|---|
| | | SSL1a | SSL2a | SSL3a | SSL4a | SSL1b | SSL2b | SSL3b | SSL4b |
| WL8 | PGM1 | 1 | 3 | 5 | 7 | 2 | 4 | 6 | 8 |
| | PGM2 | 11 | 15 | 19 | 23 | 12 | 16 | 20 | 24 |
| WL7 | PGM1 | 9 | 13 | 17 | 21 | 10 | 14 | 18 | 22 |
| | PGM2 | 27 | 31 | 35 | 39 | 28 | 32 | 36 | 40 |
| WL6 | PGM1 | 25 | 29 | 33 | 37 | 26 | 30 | 34 | 38 |
| | PGM2 | | | | | | | | |

FIG. 24

| SCRAMBLE#2 | | BLKa | | | | BLKb | | | | BLKc | | | |
|---|---|---|---|---|---|---|---|---|---|---|---|---|---|
| | | SSL1a | SSL2a | SSL3a | SSL4a | SSL1b | SSL2b | SSL3b | SSL4b | SSL1c | SSL2c | SSL3c | SSL4c |
| WL8 | PGM1 | 1 | 4 | 7 | 10 | 2 | 5 | 8 | 11 | 3 | 6 | 9 | 12 |
| | PGM2 | 25 | 28 | 31 | 34 | 26 | 29 | 32 | 35 | 27 | 30 | 33 | 36 |
| WL7 | PGM1 | 13 | 16 | 19 | 22 | 14 | 17 | 20 | 23 | 15 | 18 | 21 | 24 |
| | PGM2 | 49 | 52 | 55 | 58 | 50 | 53 | 56 | 59 | 51 | 54 | 57 | 60 |
| WL6 | PGM1 | 37 | 40 | 43 | 46 | 38 | 41 | 44 | 47 | 39 | 42 | 45 | 48 |
| | PGM2 | | | | | | | | | | | | |

FIG. 28

| SCRAMBLE#1 | | SUB_BLKa1 | | | | SUB_BLKb1 | | | |
|---|---|---|---|---|---|---|---|---|---|
| | | SSL1a | SSL2a | SSL3a | SSL4a | SSL1b | SSL2b | SSL3b | SSL4b |
| WL7 | PGM1 | 25 | 27 | 29 | 31 | 26 | 28 | 30 | 32 |
| | PGM2 | | | | | | | | |
| WL6 | PGM1 | 9 | 11 | 13 | 15 | 10 | 12 | 14 | 16 |
| | PGM2 | 33 | 35 | 37 | 39 | 34 | 36 | 38 | 40 |
| WL5 | PGM1 | 1 | 3 | 5 | 7 | 2 | 4 | 6 | 8 |
| | PGM2 | 17 | 19 | 21 | 23 | 18 | 20 | 22 | 24 |

B2T PGM

| SCRAMBLE#1 | | SUB_BLKa2 | | | | SUB_BLKb2 | | | |
|---|---|---|---|---|---|---|---|---|---|
| | | SSL1a | SSL2a | SSL3a | SSL4a | SSL1b | SSL2b | SSL3b | SSL4b |
| WL4 | PGM1 | 1 | 3 | 5 | 7 | 2 | 4 | 6 | 8 |
| | PGM2 | 17 | 19 | 21 | 23 | 18 | 20 | 22 | 24 |
| WL3 | PGM1 | 9 | 11 | 13 | 15 | 10 | 12 | 14 | 16 |
| | PGM2 | 33 | 35 | 37 | 39 | 34 | 36 | 38 | 40 |
| WL2 | PGM1 | 25 | 27 | 29 | 31 | 26 | 28 | 30 | 32 |
| | PGM2 | | | | | | | | |

T2B PGM

NONVOLATILE MEMORY DEVICE AND A METHOD OF PROGRAMMING THE NONVOLATILE MEMORY DEVICE

CROSS-REFERENCE TO RELATED APPLICATIONS

This application claims priority under 35 U.S.C. § 119/120 to Korean Patent Application No. 10-2018-0009604, filed on Jan. 25, 2018, in the Korean Intellectual Property Office, and U.S. Provisional Application No. 62/561,845, filed on Sep. 22, 2017, in the United States Patent and Trademark Office, the disclosures of which are incorporated by reference herein in their entireties.

TECHNICAL FIELD

The inventive concept relates to a non-volatile memory device and a method of programming the non-volatile memory device.

DISCUSSION OF RELATED ART

Memory devices may be classified as volatile memory devices or non-volatile memory devices. Volatile memory devices require power to maintain stored data, while non-volatile memory devices do not. Flash memory devices, which are an example of a non-volatile memory device, may be used in mobile phones, digital cameras, personal digital assistants (PDAs), mobile computer devices, stationary computer devices, and other devices. To increase density in flash memory devices, floating gate memory cells are being replaced with charge trap flash (CTF) memory cells. A CTF memory cell has a simple structure; however, the CTF memory cell may lose its charge after being programmed.

SUMMARY

According to an exemplary embodiment of the inventive concept, there is provided a method of programming a non-volatile memory device including a first memory block and a second memory block, the method including: performing a first program operation on a first memory cell in the first memory block and connected to a first word line of a first level with respect to a substrate; after the performing of the first program operation on the first memory cell, performing the first program operation on a second memory cell in the second memory block and connected to a second word line of the first level; and after the performing of the first program operation on the second memory cell, performing a second program operation on the first memory cell.

According to an exemplary embodiment of the inventive concept, there is provided a method of programming a non-volatile memory device including a first memory block and a second memory block, which includes performing a first program operation on a first memory cell in a first sub-block of the first memory block and connected to a first word line of a first level with respect to a substrate; after the performing of the first program operation on the first memory cell, performing the first program operation on a second memory cell in the first sub-block of the second memory block and connected to a second word line of the first level; and after the performing of the first program operation on the second memory cell, performing a second program operation on the first memory cell.

According to an exemplary embodiment of the inventive concept, there is provided a method of programming a non-volatile memory device including a first memory block and a second memory block, which includes performing a first program operation on a first memory cell, wherein the first memory cell is connected to a first word line, the first memory block, and a first string selection line; performing the first program operation on a second memory cell, wherein the second memory cell is connected to a second word line; the second memory block, and a second string selection line; performing the first program operation on a third memory cell connected to the first word line and a third string selection line; performing the first program operation on a fourth memory cell connected to the second word line and a fourth string selection line; and performing a second program operation on the first memory cell, wherein the first and second word lines are arranged on a same level with respect to a substrate, and the first, second, third and fourth string selection lines are arranged on a same level above the first and second word lines.

According to an exemplary embodiment of the inventive concept, there is provided a method of programming a non-volatile memory device including a first memory block and a second memory block, the method including: performing a first program operation on a selected word line of the first memory block; performing the first program operation on a selected word line of the second memory block, wherein the first program operation on the selected word line of the second memory block overlaps with a delay operation performed on the selected word line of the first memory block; performing a second program operation on the selected word line of the first memory block, wherein the second program operation overlaps with a delay operation performed on the selected word line of the second memory block; and performing the second program operation on the selected word line of the second memory block.

BRIEF DESCRIPTION OF THE DRAWINGS

The above and other features of the inventive concept will be more clearly understood by describing in detail exemplary embodiments thereof with reference to the accompanying drawings in which:

FIG. 15 is a flowchart for explaining a method of programming a non-volatile memory device according to an exemplary embodiment of the inventive concept;

FIG. 16 illustrates a memory block interleaving programming method according to the programming method of FIG. 15, according to an exemplary embodiment of the inventive concept;

FIG. 19 illustrates a block interleaving programming method according to an exemplary embodiment of the inventive concept;

FIG. 21 illustrates a block interleaving programming method according to an exemplary embodiment of the inventive concept;

FIG. 23 illustrates a block interleaving programming method according to an exemplary embodiment of the inventive concept;

FIG. 24 illustrates a block interleaving programming method according to an exemplary embodiment of the inventive concept;

FIG. 28 illustrates an example of a block interleaving programming method according to the programming method of FIG. 27, according to an exemplary embodiment of the inventive concept;

DETAILED DESCRIPTION OF THE EMBODIMENTS

Figure 1:
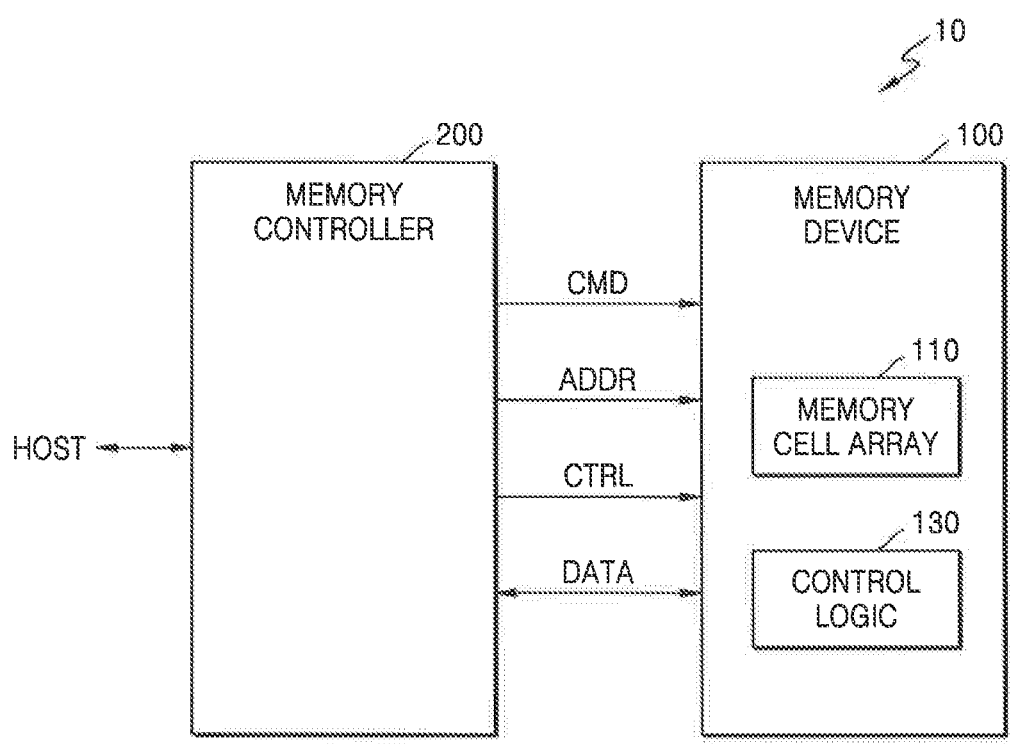
FIG. 1 is a block diagram of a memory system according to an exemplary embodiment of the inventive concept.

Hereinafter, exemplary embodiments of the present inventive concept will be described in detail with reference to the attached drawings. Like reference numerals in the drawings may denote like elements, and redundant descriptions thereof may be omitted.

FIG. 1 is a block diagram of a memory system 10 according to an exemplary embodiment of the inventive concept.

Referring to FIG. 1, the memory system 10 may include a memory device 100 and a memory controller 200. The memory device 100 may be a non-volatile memory device and may be embodied as a memory chip. The memory device 100 may include a memory cell array 110 and a control logic 130. In exemplary embodiments of the inventive concept, the memory system 10 may be embodied in an internal memory included in an electronic device, for example, an embedded universal flash storage (UFS) memory device, an embedded multi-media card (eMMC), or a solid state drive (SSD). In exemplary embodiments of the inventive concept, the memory system 10 may be embodied in an external memory that is detachable from an electronic device, for example, a UFS memory card, a compact flash (CF) card, a secure digital (SD) card, a micro-SD card, a mini-SD card, an extreme digital (xD) card, or a Memory Stick.

The memory controller 200 may control the memory device 100 to read data from the memory device 100 or to program data to the memory device 100 in response to a read/write request from a host HOST. For example, the memory controller 200 may control program, read, and erase operations of the memory device 100 by providing a command CMD, an address ADDR, and a control signal CTRL to the memory device 100. Furthermore, data DATA to program and data DATA to be read may be transmitted between the memory controller 200 and the memory device 100.

The memory cell array 110 may include a plurality of memory blocks, and an erase operation may be independently performed on each memory block. Each memory block may include a plurality of memory cells. For example, the plurality of memory cells may be a plurality of flash memory cells. In the following description, exemplary embodiments of the inventive concept are described with a ease in which the plurality of memory cells are NAND flash memory cells. In another exemplary embodiment of the inventive concept, the plurality of memory cells may be resistive memory cells such as resistive random access memory (RRAM), phase change RAM (PRAM), or magnetic RAM (MRAM).

For example, when the memory device 100 is a charge trap flash (CTF) memory device, the memory device 100 loses charges trapped in a charge trap layer for a certain amount of time after a first program operation. The loss of charges is mostly caused by charges that are shallowly trapped such that they can easily escape from the charge trap layer. In addition, the loss of charges causes a threshold voltage drift that makes a threshold voltage of memory cells less than an initially programmed voltage level, thereby deteriorating reliability of the memory device 100. Since most shallow trapped charges escape a programmed state within a few milliseconds, the charge loss may last for only a few milliseconds. Afterwards, the threshold voltage of memory cells is stabilized. To reduce the threshold voltage drift, a method of performing a second program operation after a sufficiently long time from the first program operation may be considered. However, in this case, since a total program time increases, the performance of the memory device 100 may deteriorate.

According to an exemplary embodiment of the inventive concept, the control logic 130 may control a program operation of the memory cell array 110 such that data is programmed in a plurality of memory blocks in a block interleaving programming method. According to the block interleaving programming method, a first program operation may be performed on memory cells connected to a selected word line of a first memory block. Next, the first program operation may be performed on memory cells connected to a selected word line of a second memory block. Next, a second program operation may be performed on the memory cells connected to the selected word line of the first memory block. Accordingly, with respect to the selected word line of the first memory block, since a sufficiently long time is secured between the first program operation and the second program operation, the threshold voltage drift of memory cells connected to the selected word line may not occur. Furthermore, since the first program operation is performed on the selected word line of the second memory block between the first program operation performed on the selected word line of the first memory block and the second program operation performed on the selected word line of the first memory block, the total program time does not increase, and thus, deterioration of the performance of the memory device 100 may be prevented.

Furthermore, the control logic 130 may control a bias voltage higher than a ground voltage level to be applied to the selected word line of the first memory block, after the first program operation is performed on the first memory block. For example, the bias voltage may correspond to a read voltage, a verify voltage, or a page buffer initializing voltage. Since the selected word line has a bias voltage level higher than the ground voltage level after the first program operation is completed, there may be a voltage difference between the selected word line and a channel. An initial loss of charges may be accelerated due to the voltage difference. Accordingly, a time for stabilizing the threshold voltage of a memory cell may be reduced.

Furthermore, the control logic. 130 may control a bias voltage higher than the ground voltage level to be applied to the selected word line of the first memory block, after the second program operation is performed on the first memory block. For example, the bias voltage may correspond to the read voltage, the verify voltage, or the page buffer initializing voltage. In an exemplary embodiment of the inventive concept, the bias voltage applied to the selected word line after the first program operation may have a voltage level different from the bias voltage applied to the selected word line after the second program operation. However, the inventive concept is not limited thereto, and the bias voltage applied to the selected word line after the first program operation may have the same voltage level as the bias voltage applied to the selected word line after the second program operation.

Figure 2:
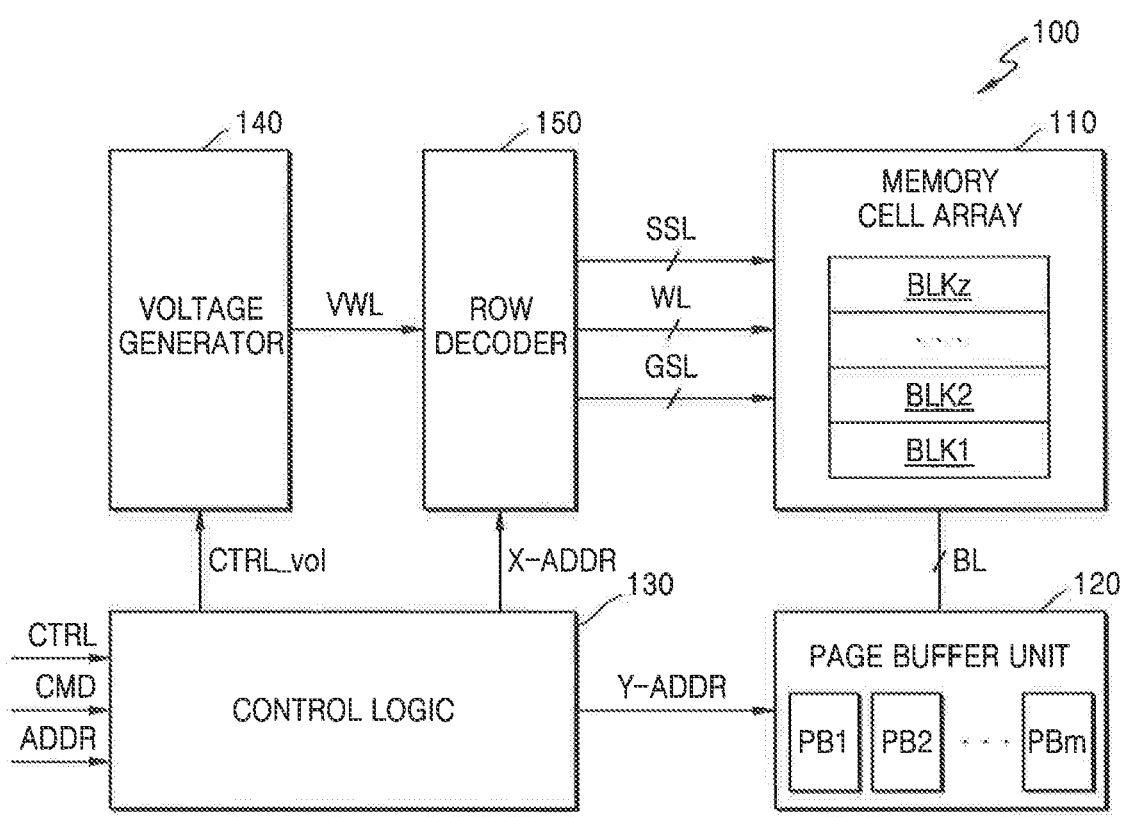
FIG. 2 is a block diagram of the memory device of FIG. 1, according to an exemplary embodiment of the inventive concept.

FIG. 2 is a block diagram of the memory device 100 of FIG. 1, according to an exemplary embodiment of the inventive concept. Referring to FIG. 2, the memory device 100 may include the memory cell array 110, a page buffer unit 120, the control logic 130, a voltage generator 140, and a row decoder 150. The memory device 100 may further include a data input/output circuit or an input/output interface.

The memory cell array 110 may be connected to the page buffer unit 120 via bit lines BL, and to the row decoder 150 via word lines WL, string selection lines SSL, and ground selection lines GSL. The memory cell array 110 may include a plurality of memory blocks BLK1 to BLKz, and each of the memory blocks BLK1 to BLKz may include a plurality of memory cells. Each memory cell may store one or more bits. For example, each memory cell may be a single level cell (SLC), a multi-level cell (MLC), a triple level cell (TLC), or a quadruple level cell (QLC). In an exemplary embodiment of the inventive concept, some memory blocks of the memory blocks BLK1 to BLKz may be SLC blocks, and other memory blocks may be MLC, TLC, or QLC blocks. As the number of bits stored in the memory cell increase, a threshold voltage difference between adjacent program states may decrease. Accordingly, a technique for controlling a change of a threshold voltage is used in a program process.

The page buffer unit 120 may include a plurality of page buffers PB1 to PBm, where "m" is an integer equal to or greater than 2. In an exemplary embodiment of the inventive concept, each page buffer may be connected to one hit line (see FIG. 29). In an exemplary embodiment of the inventive concept, each page buffer may be connected to one bit line group, and a plurality of bit lines included in one bit line group may share one page buffer (see FIGS. 31 and 33). Various embodiments of the page buffer unit 120 are described later with reference to FIGS. 29 to 34.

The control logic 130 may output various control signals to write data to the memory cell array 110 or read out data from the memory cell array 110, based on a command CMD, an address ADDR, and a control signal CTRL. Accordingly, the control logic 130 may control various operations in the memory device 100. In an exemplary embodiment of the inventive concept, the control logic 130 may provide a voltage control signal CTRL_vol, a row address X-ADDR, and a column address Y-ADDR to perform a program operation by the block interleaving programming method on a plurality of memory blocks, for example, a first memory block BLK1 and a second memory block BLK2.

The voltage generator 140 may generate a variety of types of voltages to perform program, read, and erase operations on the memory cell array 110 based on the voltage control signal CTRL_vol. For example, the voltage generator 140 may generate a word line voltage VWL, for example, a program voltage, a read voltage, a pass voltage, an erase verify voltage, or a program verify voltage. Furthermore, the voltage generator 140 may further generate a string selection line voltage and a ground selection line voltage based on the voltage control signal CTRL_vol.

The row decoder 150 may select, in response to the row address X-ADDR, one of the memory blocks BLK1 to BLKz, select one of the word lines WL of the selected memory block, and select one of the string selection lines SSL. The page buffer unit 120 may select, in response to the column address Y-ADDR, some of the bit lines BL. For example, the page buffer unit 120 may operate as a write driver or a sense amplifier according to an operation mode.

Figure 3:
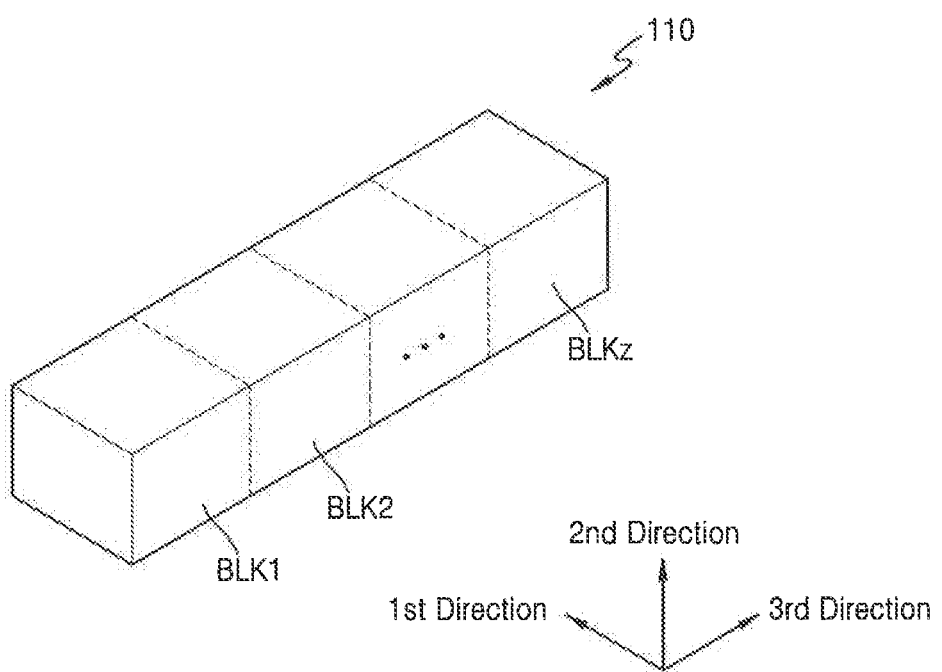
FIG. 3 illustrates the memory cell array of FIG. 2, according to an exemplary embodiment of the inventive concept.

FIG. 3 illustrates the memory cell array 110 of FIG. 2, according to an exemplary embodiment of the inventive concept. Referring to FIG. 3, the memory cell array 110 may include the memory blocks BLK1 to BLKz, and each of the memory blocks BLK1 to BLKz may have a three-dimensional (3D) structure. Accordingly, the memory cell array 110 may be referred to a 3D memory cell array.

In an exemplary embodiment of the inventive concept, the 3D memory cell array may include an active area arranged on a silicon substrate and circuits associated with the operation of memory cells. The circuits may be monolithically formed on or in the substrate with at least one physical level of the memory cell array. The term "monolithic" may refer to a structure in which layers of each level constituting the array are stacked just above layers of each lower level of the array.

In an exemplary embodiment of the present inventive concept, the 3D memory array includes vertical NAND strings that are vertically oriented such that at least one memory cell is located over another memory cell. The at least one memory cell may comprise a charge trap layer. The following patent documents, which are hereby incorporated by reference in their entireties, describe configurations for 3D memory arrays, in which the 3D memory array is configured as a plurality of levels, with word lines and/or bit lines shared between levels: U.S. Pat. Nos. 7,679,133; 8,553,466; 8,654,587; 8,559,235; and U.S. Pat. Pub. No. 2011/0233648.

Figure 4:
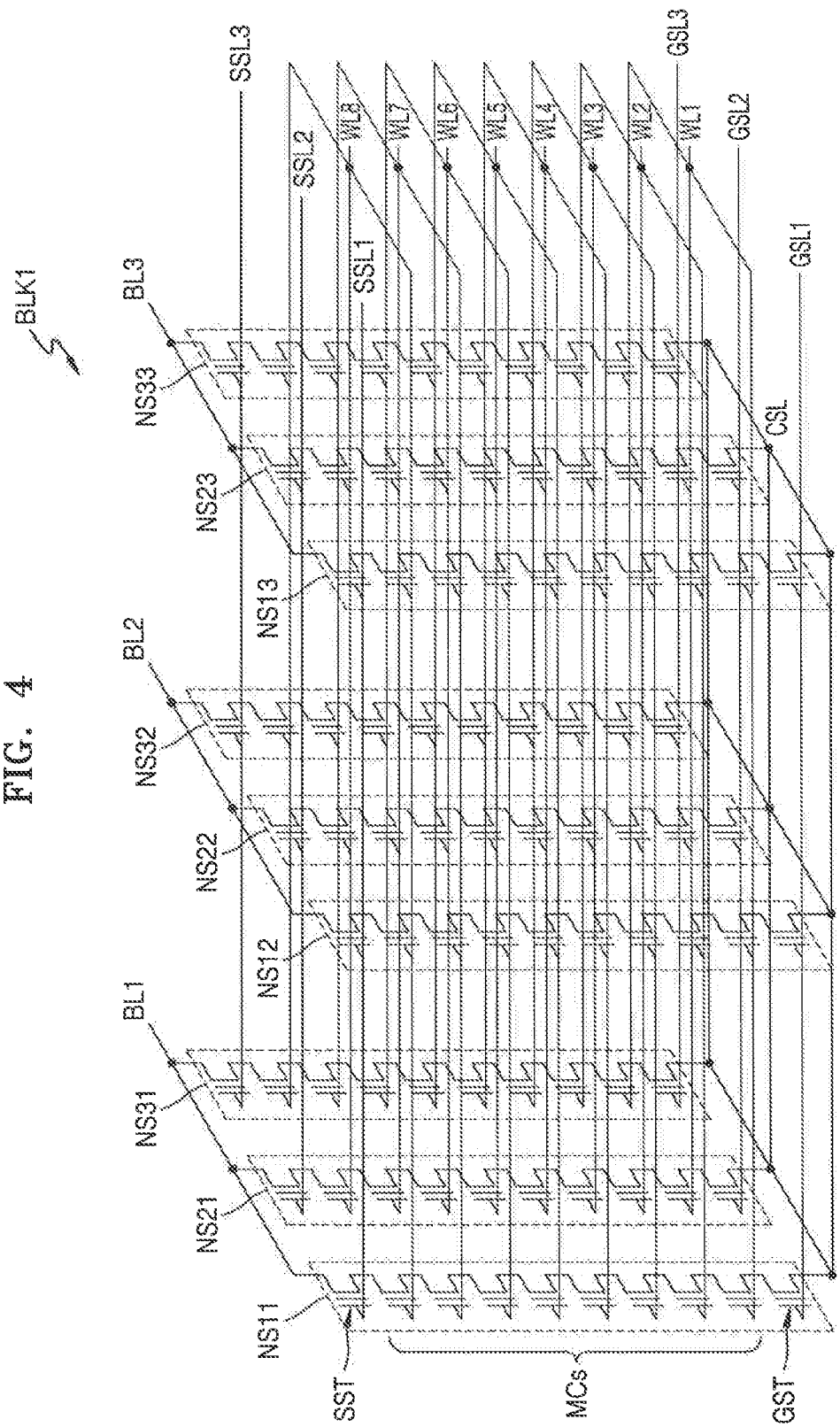
FIG. 4 is an equivalent circuit diagram of the first memory block of FIG. 3, according to an exemplary embodiment of the inventive concept.

FIG. 4 is an equivalent circuit diagram showing the first memory block BLK1 of FIG. 3, according to an exemplary embodiment of the inventive concept.

Referring to FIG. 4, the first memory block BLK1 may include NAND strings NS11, NS21, NS31, NS12, NS22, NS32, NS13, NS23 and NS33, word lines WL1, WL2, WL3, WL4, WL5, WL6, WL7 and WL8, bit lines BL1, BL2 and BL3, ground selection lines GSL1, GSL2 and GSL3, string selection lines SSL1, SSL2 and SSL3, and a common source line CSL. Each NAND string, for example, NS11, may include a string selection transistor SST, a plurality of memory cells MCs, and a ground selection transistor GST, which are connected in series.

Figure 5:
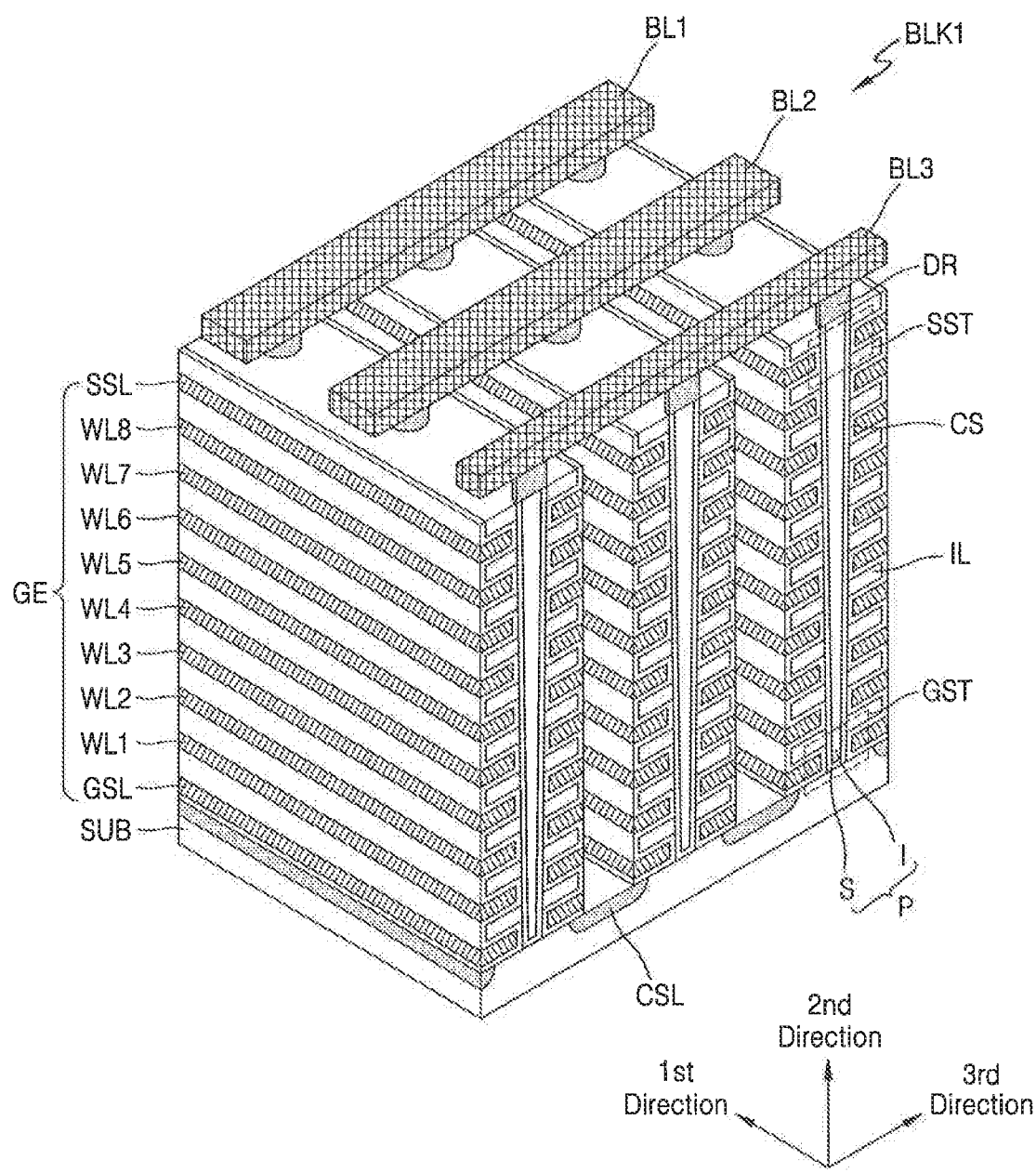
FIG. 5 is a perspective view of the first memory block of FIG. 4, according to an exemplary embodiment of the inventive concept.

FIG. 5 is a perspective view of the first memory block BLK1 of FIG. 4, according to an exemplary embodiment of the inventive concept.

Referring to FIG. 5, the first memory block BLK1 is formed perpendicular to a substrate SUB. The common source line CSL extending in a first direction is provided on the substrate SUB. Insulating films IL are provided in an area of the substrate SUB between the adjacent common source lines CSL, and the insulating films IL are spaced apart from each other by a certain distance in a second direction. Pillars P penetrating through the insulating films IL in the second direction are provided in the area of the substrate SUB between the adjacent common source lines CSL. For example, a surface layer S of each pillar P may include a silicon material having a first type, for example, a p type, and may function as a channel area. An inner layer I of each pillar P may include an insulating material such as a silicon oxide, or an air gap.

A charge storage layer CS is provided along exposed surfaces of the insulating films IL, the pillars P, and the substrate SUB in the area between the adjacent common source lines CSL. The charge storage layer CS may include a tunnelling insulating layer, a charge trap layer, and a blocking insulating layer. Furthermore, a gate electrode GE such as ground and string selection lines GSL and SSL and the word lines WL1 to WL8 is provided on the exposed surface of the charge storage layer CS in the area between the two adjacent common source lines CSL. Drain contacts DR are respectively provided on the pillars P. The bit lines BL1 to BL3 extending in a third direction and arranged spaced apart from each other by a certain distance in the first direction are provided on the drain contacts DR.

Figure 6:
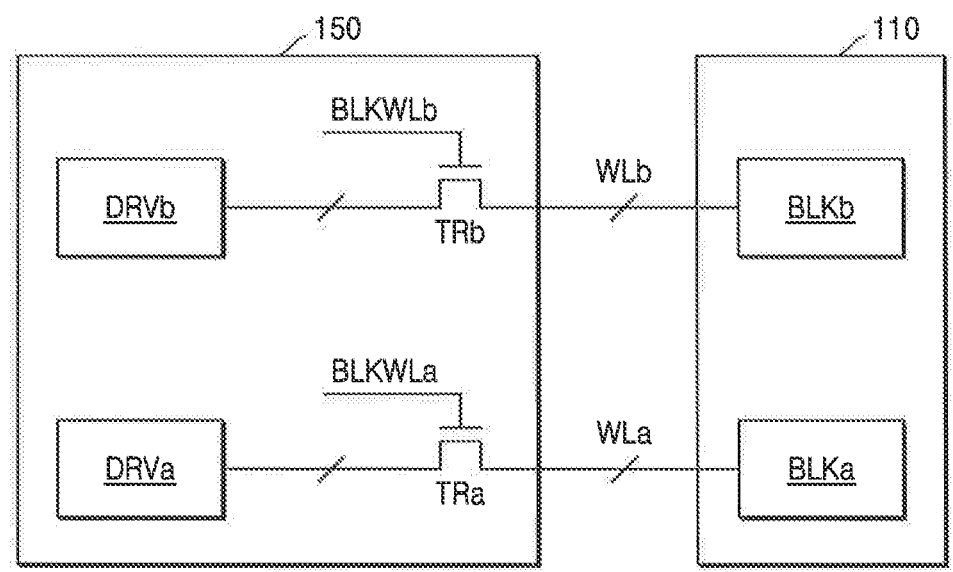
FIG. 6 is a block diagram of a memory cell array including first and second memory blocks, according to an exemplary embodiment of the inventive concept.

FIG. 6 is a block diagram of the memory cell array 110 including first and second memory blocks BLKa and BLKb, according to an exemplary embodiment of the inventive concept.

Referring to FIG. 6, the first and second memory blocks BLKa and BLKb may independently perform an erase operation. In an exemplary embodiment of the inventive concept, the first memory block BLKa may be connected to first block transistors TRa, and the second memory block BLKb may be connected to second block transistors TRb. The first block transistors TRa may be driven according to a voltage level of a first block word line BLKWLa, and the second block transistors TRb may be driven according to a voltage level of a second block word line BLKWLb.

The row decoder 150 may include first and second drivers DRVa and DRVb and the first and second block transistors TRa and TRb. Each of the first block transistors TRa may be connected to the first memory block BLKa via a plurality of word lines WLa, and each of the second block transistors TRb may be connected to the second memory block BLKb via a plurality of word lines WLb. The first and second drivers DRVa and DRVb, in response to the row address X-ADDR, may apply the word line voltage VWL received from the voltage generator 140 to each of the word lines WKa and WLb.

Figure 7:
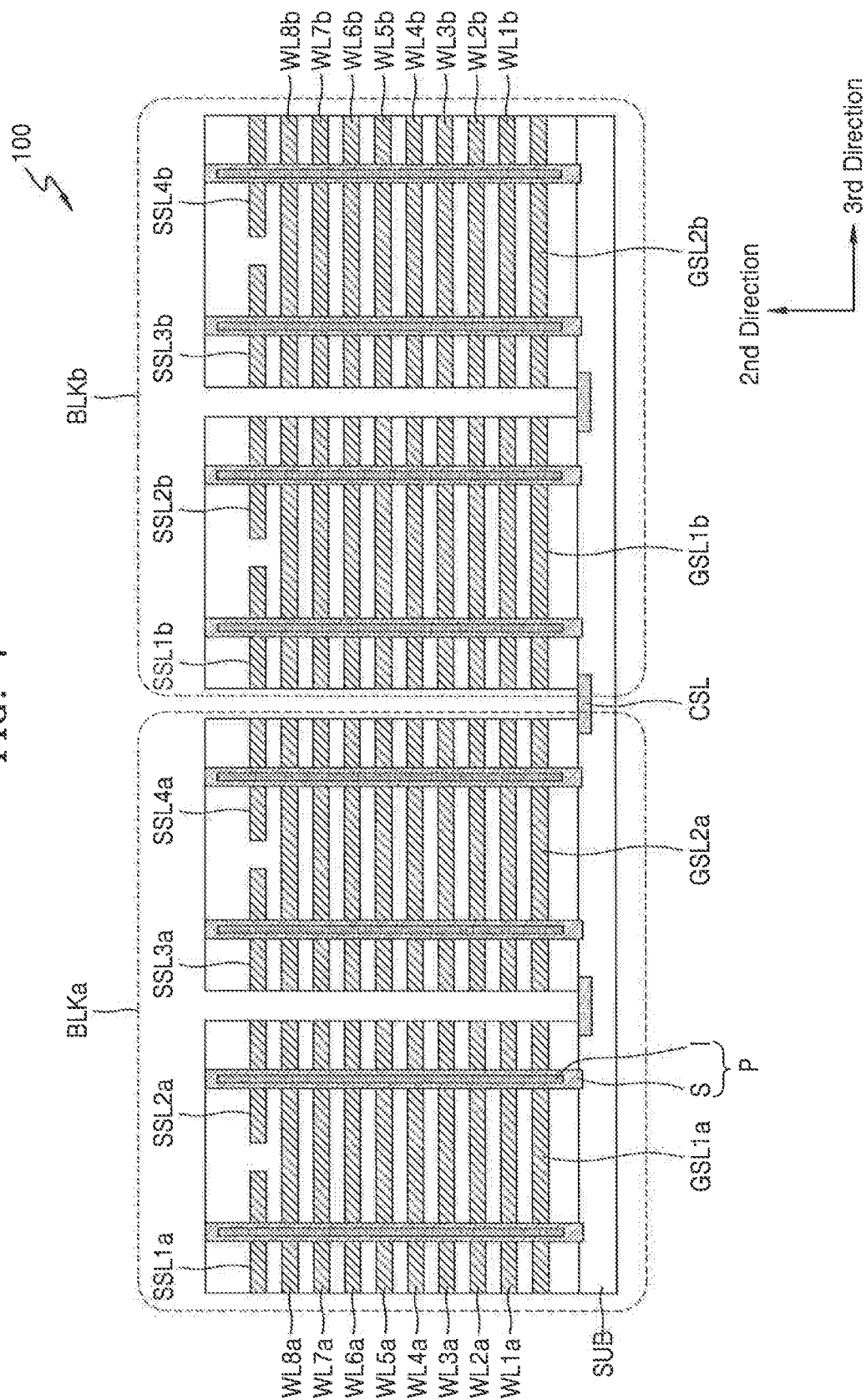
FIG. 7 is a cross-sectional view of a memory device including the first and second memory blocks, according to an exemplary embodiment of the inventive concept.
Figure 8:
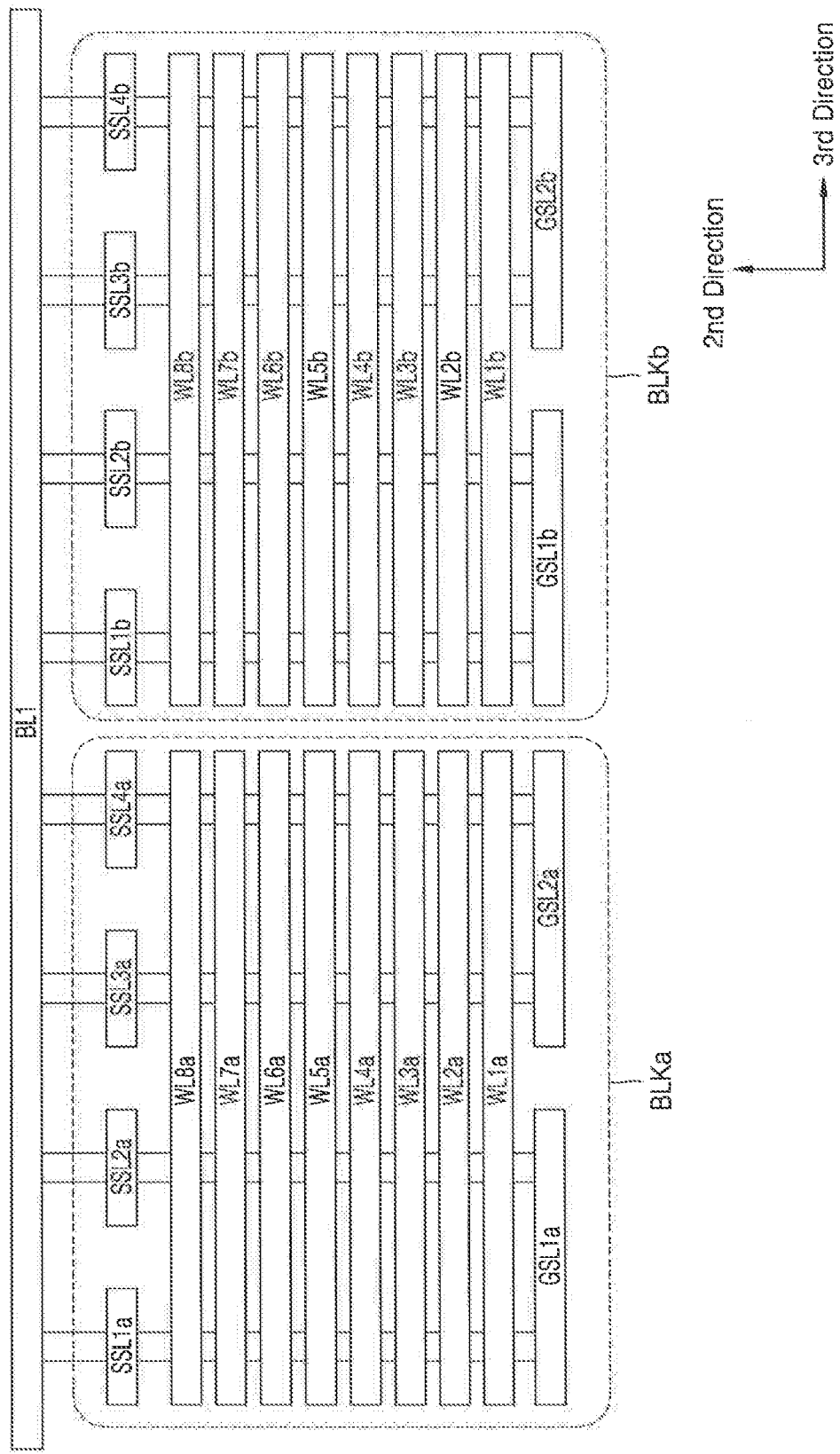
FIG. 8 illustrates an electrical connection of the first and second memory blocks of FIG. 7, according to an exemplary embodiment of the inventive concept.

FIG. 7 is a cross-sectional view of the memory device 100 including the first and second memory blocks BLKa and BLKb, according to an exemplary embodiment of the inventive concept. FIG. 8 illustrates an electrical connection of the first and second memory blocks BLKa and BLKb of FIG. 7, according to an exemplary embodiment of the inventive concept.

Referring to FIGS. 7 and 8, the first memory block BLKa may be connected to the word lines WL1a, WL2a, WL3a, WL4a, WL5a, WL6a, WL7a and WL8a vertically stacked above the substrate SUB, and the word lines WL1a to WL8a arranged on the same level may be electrically connected to one another. The second memory block BLKb may be connected to the word lines WL1b, WL2b, WL3b, WL4b, WL5b, WL6b, WL7b and WL8b vertically stacked above the substrate SUB, and the word lines WL1b to WL8b arranged on the same level may be electrically connected to one another. Alternatively, while arranged on the same level, the word line WL1a connected to the first memory block BLKa and the word line WL1b connected to the second memory block BLKb may not be connected to one another and may receive different voltages. In the following description, programming methods according to various embodiments are described with reference to an example of the first and second memory blocks BLKa and BLKb.

In FIG. 7, the word lines of the WL1a to WL8a of the first memory block BLKa are connected to first, second, third and fourth string selection lines SSL1a, SSL2a, SSL3a and SSL4a, and first and second ground selection lines GSL1a and GSL2a. In FIG. 7, the word lines of the WL1b to WL8b of the second memory block BLKb are connected to first, second, third and fourth string selection lines SSL1b, SSL2b, SSL3b and SSL4b, and first and second ground selection lines GSL1b and GSL2b. In FIG. 8, the string selection lines SSL1a to SSL4a of the first memory block BLKa and the string selection lines SSL1b to SSL4b of the second memory block BLKb are connected to a first bit line BL1.

Figure 9:
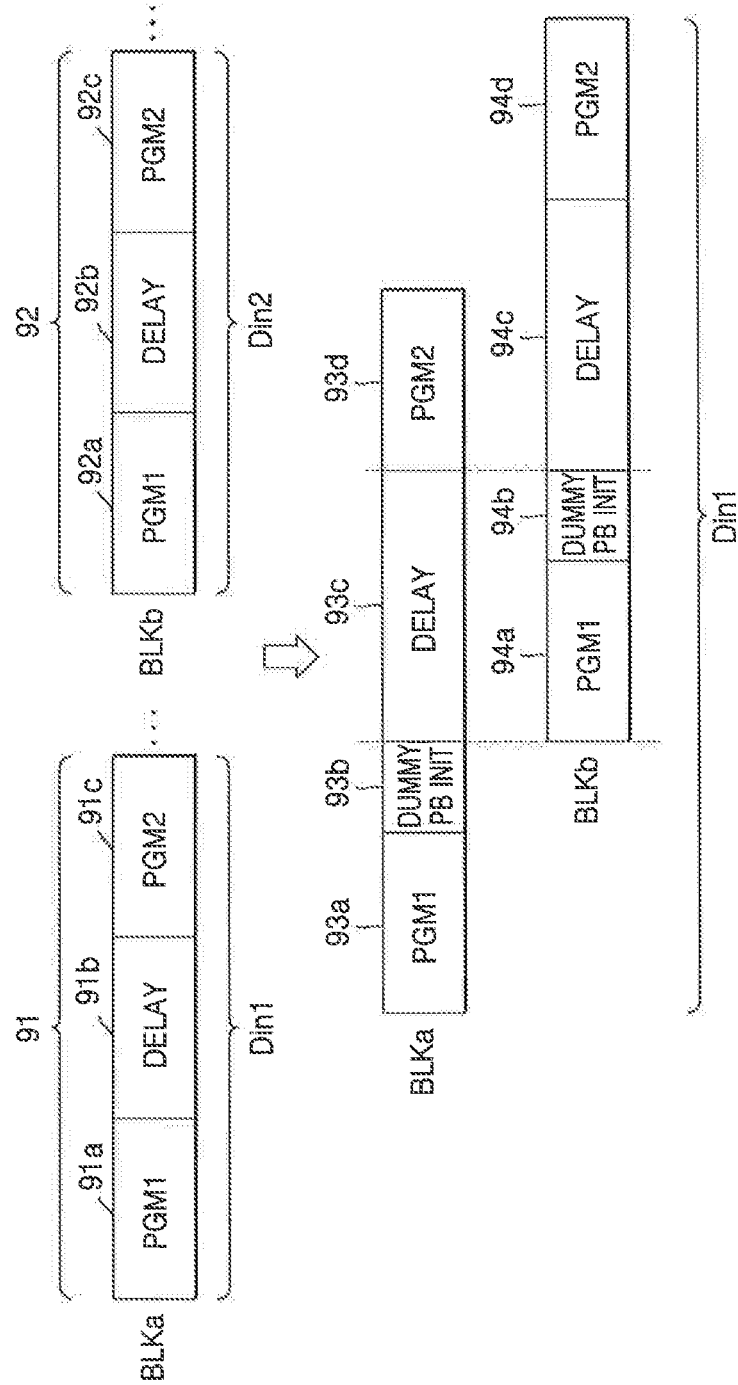
FIG. 9 illustrates a block interleaving programming method according to an exemplary embodiment of the inventive concept.

FIG. 9 illustrates a block interleaving programming method, according to an exemplary embodiment of the inventive concept.

Referring to FIG. 9, in a normal programming method according to a comparative example, when a program operation is performed on first input data Din1, the first memory, block BLKa that is one of a plurality of memory blocks may be selected and a first program sequence 91 may be performed on the first memory block BLKa. The first program sequence 91 may include a first program operation (PGM1) 91a, a delay 91b, and a second program operation (PGM2) 91c, which are sequentially preformed. When the program operation performed on the first input data Din1 is completed, a program operation may be performed on second input data Din2. In this case, the second memory block BLKb that is the other one of the memory blocks may be selected, and a second program sequence 92 may be performed on the second memory block BLKb. The second program sequence 92 may include a first program operation 92a, a delay 92b, and a second program operation 92c, which are sequentially performed.

However, in the block interleaving programming method according to an exemplary embodiment of the inventive concept, when a program operation is performed on the first input data Din1, at least two memory blocks of the memory blocks, for example, the first and second memory blocks BLKa and BLKb, may be selected, and the program operation may be alternately performed on the selected first and second memory blocks BLKa and BLKb. The programming method may be referred to as the "block interleaving programming method" or "large block programming method".

For example, a first program operation 93a may be performed on the selected word line of the first memory block BLKa, and then, a dummy page buffer initialization operation 93b may be performed on the selected word line of the first memory block BLKa. The dummy page buffer initialization operation 93b may be an operation of applying a bias voltage having a voltage level higher than the ground voltage level to the selected word line and the unselected word line. The dummy page buffer initialization operation 93b may be referred to as the dummy read operation. Next, a first program operation 94a may be performed on the selected word line of the second memory block BLKb, and then, a dummy page buffer initialization operation 94b may be performed on the selected word line of the second memory block BLKb. In this case, while the first program operation 94a and the dummy page buffer initialization operation 94b are performed on the selected word line of the second memory block BLKb, a delay 93c may be performed on the selected word line of the first memory block BLKa.

Next, a second program operation 93d may be performed on the selected word line of the first memory block BLKa. In this case, while the second program operation 93d is performed on the selected word line of the first memory block BLKa, a delay 94c may be performed on the selected word line of the second memory block BLKb. Next, a second program operation 94d may be performed on the selected word line of the second memory block BLKb. As such, in a time between the first program operation 94a and the second program operation 94d performed on the selected word line of the second memory block BLKb, the dummy page buffer initialization operation 94b and the delay 94c may be performed on the selected word line of the second memory block BLKb. The dummy page buffer initialization operation 94b may be performed in a manner substantially similarly to the dummy page buffer initialization operation 93b.

In an exemplary embodiment of the inventive concept, the size of the first input data Din1 may correspond to data corresponding to the number of hit lines connected to one MAT or plane, one string selection line, and one word line. For example, when hit lines connected to one word line is 16 KB, the first input data Din1 may include 16 KB data that is input to bit lines of 16 KB.

Figure 10A:
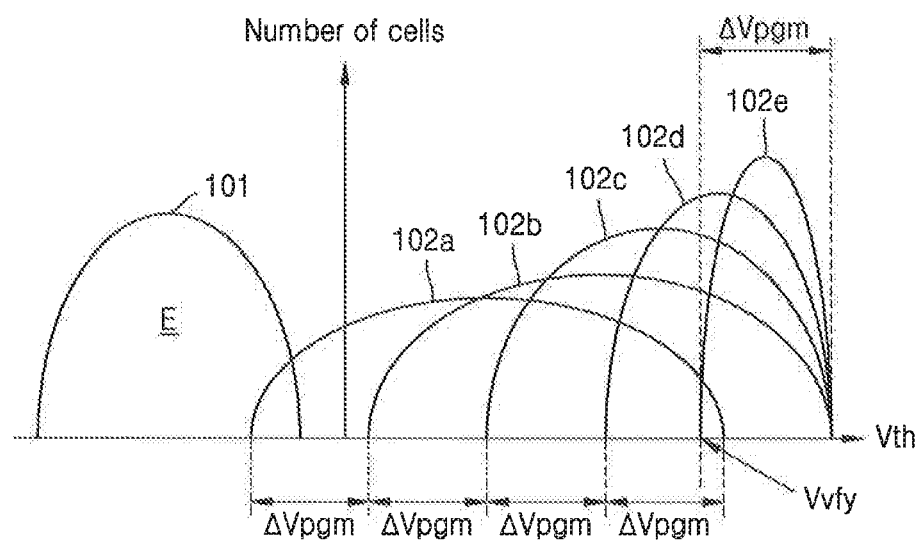
FIG. 10A illustrates a threshold voltage distribution of memory cells according to each of the first and second program operations of FIG. 9, according to an exemplary embodiment of the inventive concept.
Figure 10B:
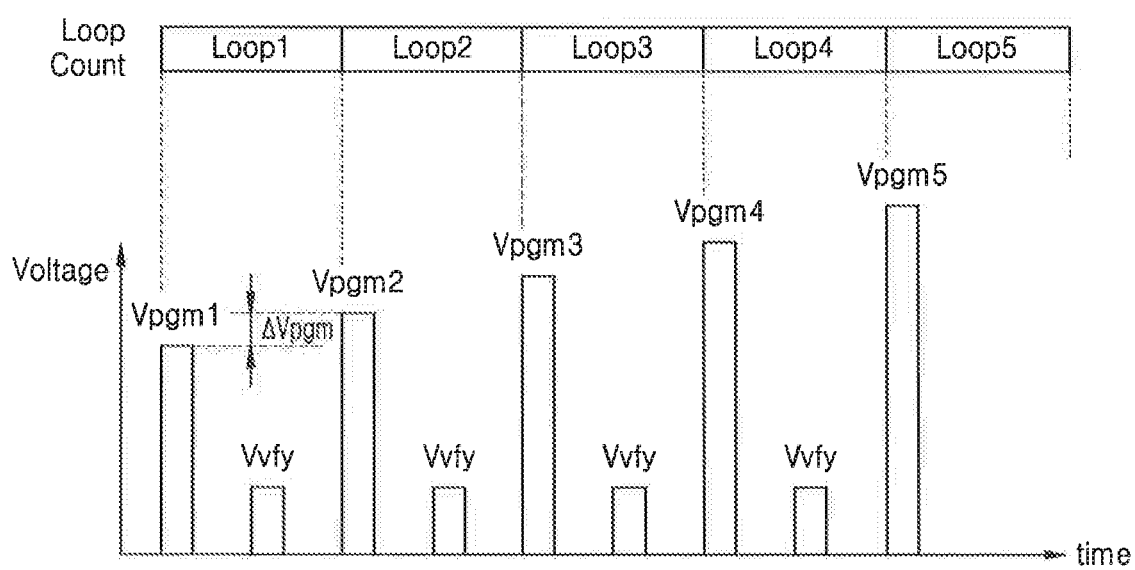
FIG. 10B illustrates a programming method for forming the threshold voltage distribution of FIG. 10A, according to an exemplary embodiment of the inventive concept.

FIG. 10A illustrates a threshold voltage distribution of memory cells according to each of the first and second program operations of FIG. 9, according to an exemplary embodiment of the inventive concept. FIG. 10B illustrates a programming method for forming the threshold voltage distribution of FIG. 10A, according to an exemplary embodiment of the inventive concept.

Referring to FIG. 10A, the horizontal axis indicates a threshold voltage Vth of a memory cell, and the vertical axis indicates the number of memory cells. Memory cells in an erase state 101 may be programmed by a first program loop Loop1 to a first preliminary program state 102a. Memory cells of the first preliminary program state 102a may be programmed by a second program loop Loop2 to a second preliminary program state 102b. Memory cells of the second preliminary program state 102b may be programmed by a third program loop Loop3 to a third preliminary program state 102c. The memory cells programmed to the third preliminary program state 102c may be programmed by a fourth program loop Loop4 to a fourth preliminary program state 102d. The memory cells in the fourth preliminary program state 102d may be programmed by a fifth program loop Loop5 to a target program state 102e.

Referring to FIG. 10B, the horizontal axis indicates time, and the vertical axis indicates a word line voltage. A memory device may perform a plurality of program loops to program memory cells to have one of an erase state and at least one of program states. In an exemplary embodiment of the inventive concept, the program loops may include the first to fifth program loops Loop1 to Loop5, and each of the first to fourth program loops Loop1 to Loop4 may include a program step for applying program pulses Vpgm1 to Vpgm4 and a verify step for applying a verify voltage Vvfy. In the first program loop Loop1, the first program pulse Vpgm1 may be applied to the selected word line, and then, the verify voltage Vvfy may be applied to the selected word line. In the second program loop Loop2, to program memory cells other than program passed memory cells, the second program pulse Vpgm2 that is higher than the first program pulse Vpgm1 by as much as a program voltage increment ΔVpgm is applied to the selected word line, and then, the verify voltage Vvfy may be applied to the selected word line. A voltage level of the verify voltage Vvfy during the first program operation may be lower than a voltage level of the verify voltage Vvfy during the second program operation.

In an exemplary embodiment of the inventive concept, in the fifth program loop Loop5, a fifth program pulse Vpgm5 may be applied to the selected word line, and the verify step may be omitted. In this case, as shown in a second graph 112 of FIG. 11, an operation in a dummy period DMY may be performed after the fifth program loop Loop5, in the dummy period DMY, a bias voltage having a voltage level higher than the ground voltage level may be applied to the selected word line. In exemplary embodiments of the inventive concept, the fifth program loop Loop5 may include the verify step. In this case, since the verify voltage Vvfy is applied to the selected word line, there may be a voltage difference between the selected word line and the channel. Accordingly, the initial loss of charges may be accelerated after the fifth program loop Loop5, and thus, a time needed to stabilize the threshold voltage of a memory cell may be reduced.

Figure 11:
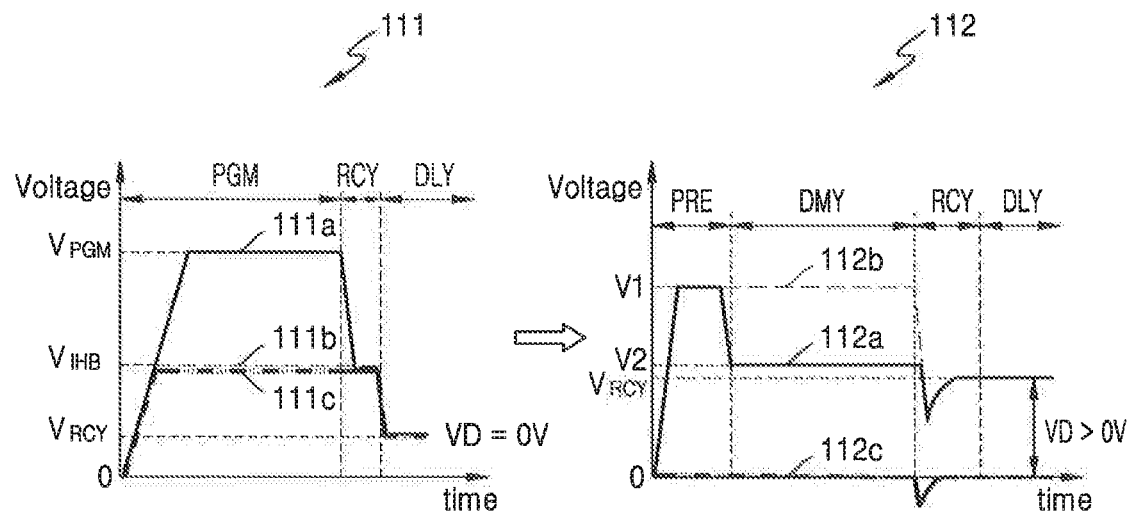
FIG. 11 illustrates first and second graphs showing bias conditions according to the block interleaving programming method of FIG. 9, according to an exemplary embodiment of the inventive concept.
Figure 12:
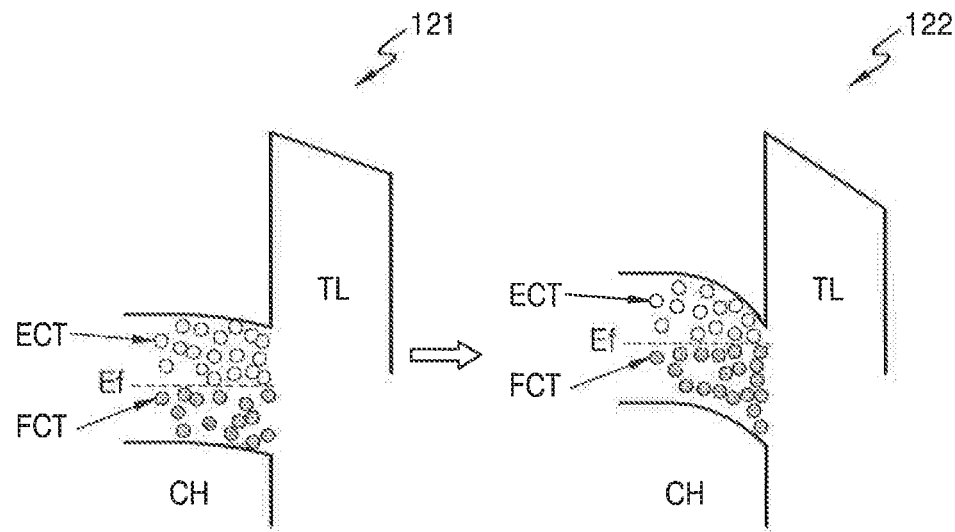
FIG. 12 illustrates first and second energy band diagrams between a channel and a tunnel insulating layer of a memory device, in a delay period of each of the first and second graphs of FIG. 11, according to an exemplary embodiment of the inventive concept.

FIG. 11 illustrates first and second graphs 111 and 112 showing bias conditions according to the block interleaving programming method of FIG. 9, according to an exemplary embodiment of the inventive concept. FIG. 12 illustrates first and second energy band diagrams 121 and 122 between a channel CH and a tunnel insulating layer TL of a memory device, in a delay period of each of the first and second graphs 111 and 112 of FIG. 11, according to an exemplary embodiment of the inventive concept.

The first graph 111 corresponds to the normal programming method according to a comparative example and shows a voltage of a selected word line 111a, an unselected word line 111b, and a channel 111c, according to time. A program period PGM and a recover), period RCY may correspond to, for example, the first program operation 91a of FIG. 9, and a delay period DLV may correspond to, for example, the delay 91b of FIG. 9. In the program period PGM, a program voltage $V_{PGM}$ is applied to the selected word line 111a, and an inhibit voltage $V_{IHB}$ is applied to the unselected word line 111b, and thus, the channel 111c has a voltage level corresponding to the inhibit voltage $V_{IHB}$ due to channel boosting. In the recovery period RCY, the voltages applied to the selected word line 111a and the unselected word line 111b are decreased to a recovery voltage $V_{RCY}$. Accordingly, the channel 111c has a voltage level corresponding to the recovery voltage $V_{RCY}$. Accordingly, in the delay period DLY, a voltage difference VD between the selected word line 111a, the unselected word line 111b, and the channel 111c corresponds to about 0 V.

As such, according to the normal programming method, since the voltage difference VD among the selected word line 111a, the unselected word line 111b, and the channel 111c is small, and the delay period IDLY between the first program operation and the second program operation with respect to the first memory block BLKa is relatively short, in the first energy band diagram 121, an inclination of the tunnel insulating layer TL may be relatively low. Further more, in the first energy band diagram 121, the number of empty channel traps ECT equal to or greater than a Fermi level Ef of the channel CH may be greater than the number of filled channel traps FCT equal to or less than the Fermi level Ef.

The second graph 112 corresponds to the block interleaving programming method according to an exemplary embodiment of the inventive concept, and shows voltages of a selected word line 112a, an unselected word line 112b, and a channel 112c according to time. In a pre-pulse period PRE, a first bias voltage V1 is applied to the selected word line 112a and the unselected word line 112b, and the channel 112c may maintain 0 V. In the dummy period DMY, a second bias voltage V2 that is lower than the first bias voltage V1 is applied to the selected word line 112a, and the first bias voltage V1 is kept applied to the unselected word line 112b, and thus, the channel 112c may maintain 0 V. In the recovery, period RCY, the voltages applied to the selected word line 112a and the unselected word line 112b are decreased to the recovery voltage $V_{RCY}$, thereby decreasing the voltage of the channel 112c by a certain level, and then, the voltage of the channel 112c is maintained at 0 V again. Accordingly, in the delay period DLY, the voltage difference VD among the selected word line 112a, the unselected word line 112b, and the channel 112c becomes greater than 0 V.

As such, according to the block interleaving programming method of the inventive concept, since the voltage difference VD between the selected word line 112a, the unselected word line 112b, and the channel 112c is relatively large, and the delay period DLY between the first program operation and the second program operation with respect to the first memory block BLKa is relatively long, the inclination of the tunnel insulating layer TL in the second energy band diagram 122 may be greater than that of the first energy band diagram 121. Furthermore, in the second energy band diagram 122, the number of the filled channel traps FCT equal to or less than the Fermi level Ef of the channel CH may be greater than that of the first energy band diagram 121. A channel trap state as described above may be identical to a channel trap state when a read operation is performed.

Figure 13:
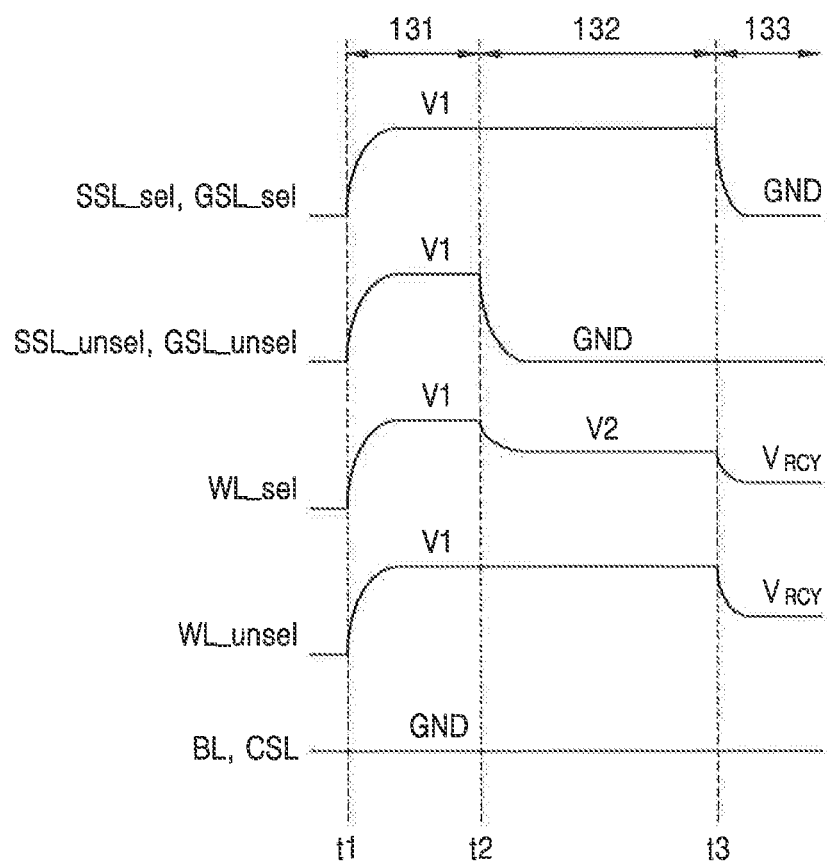
FIG. 13 illustrates bias conditions for a memory block for a time between a first program operation and a second program operation, according to an exemplary embodiment of the inventive concept.

FIG. 13 illustrates bias conditions for a memory block for a time between a first program operation and a second program operation, according to an exemplary embodiment of the inventive concept.

Referring to FIG. 13, a first period 131 between a first time t1 and a second time t2 may correspond to, for example, the pre-pulse period PRE of FIG. 11. A second period 132 between the second time t2 and a third time t3 may correspond to, for example, the dummy-period DMY of FIG. 11. Furthermore, the first and second periods 131 and 132 may correspond to, for example, a time period in which the dummy page buffer initialization operation 93b is performed on the first memory block BLKa of FIG. 9. A third period 133 after the third time t3 may correspond to, for example, the recovery period RCY and the delay period DLY of FIG. 11. Furthermore, the third period 133 may correspond to, for example, a time period for the delay 93c of the first memory block BLKa of FIG. 9.

In the first period 131, the first bias voltage V1 is applied to a selected string selection line SSL_sel, a selected ground selection line GSL_sel, an unselected string selection line SSL_unsel, an unselected ground selection line GSL_unsel, a selected word line WL_set, and an unselected word line WL_unsel. Still in the first period 131, a ground voltage GND is applied to the bit lines BL and the common source line CSL. In the second period 132, the second bias voltage V2 that is lower than the first bias voltage V1 is applied to the selected word line WL_sel, and the ground voltage GND is applied to the unselected string selection line SSL_unsel and the unselected ground selection line GSL_unsel. In the third period 133, the ground voltage GND is applied to the selected siring selection line SSL_sel and the selected ground selection line GSL_sel, and the recovery voltage $V_{RCY}$ is applied to the selected word line WL_sel and the unselected word line WL_unsel.

Figure 14:
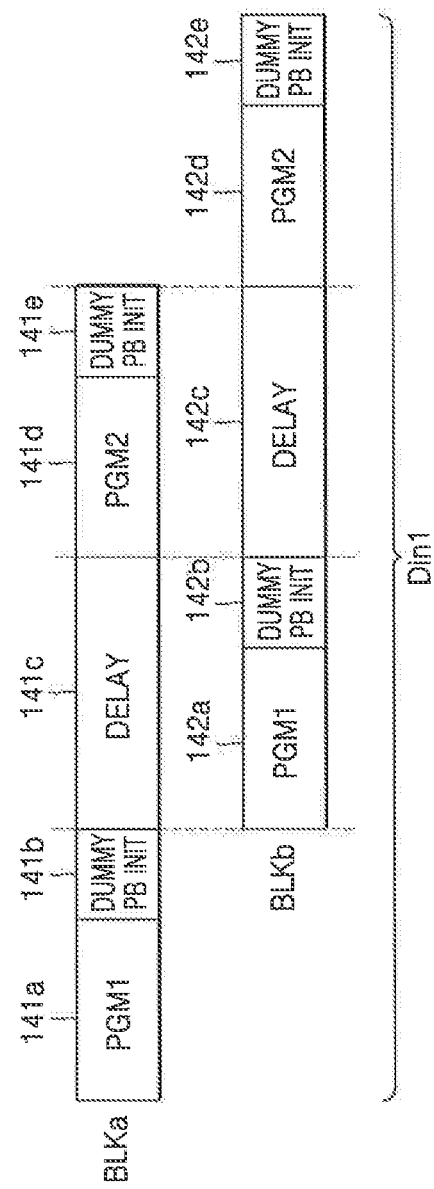
FIG. 14 illustrates a block interleaving programming method, according to an exemplary embodiment of the inventive concept.

FIG. 14 illustrates a block interleaving programming method, according to an exemplary embodiment of the inventive concept. The block interleaving programming method according to the present embodiment corresponds to the block interleaving programming method of FIG. 9, and the descriptions provided above with reference to FIG. 9 to FIG. 13 may be applied to the present embodiment.

Referring to FIG. 14, when a program operation is performed on the first input data Din1, the program operation may be alternately performed on the first and second memory blocks BLKa and BLKb. For example, after a second program operation 141d is performed on the first memory block BLKa, a dummy page buffer initialization operation 141e may be performed on the first memory block BLKa, and after a second program operation 142d is performed on the second memory block BLKb, the dummy page buffer initialization operation 142e may be performed on the second memory block BLKb. In an exemplary embodiment of the inventive concept, the recovery voltage applied to the word line during the dummy page buffer initialization operations 141b and 142b, and the recovery voltage applied to the word line during the dummy page buffer initialization operations 141e and 142e, may be different from each other, in an exemplary embodiment of the inventive concept, the recovery time for the dummy page buffer initialization operations 141b and 142b and the recovery time for the dummy page buffer initialization operations 141e and 142e may be different from each other.

FIG. 15 is a flowchart for explaining a method of programming a non-volatile memory device, according to an exemplary embodiment of the inventive concept. FIG. 16 illustrates a memory block interleaving programming method according to the programming method of FIG. 15, according to an exemplary embodiment of the inventive concept. In the present embodiment, a method of performing a program operation by a block interleaving programming method with respect to memory blocks may include, for example, operations performed in a time-series method in the memory device 100 of FIG. 2. The descriptions provided above with reference to FIGS. 1 to 14 may be applied to the present embodiment.

In operation S110, a first program operation is performed on a first memory cell arranged in the first memory block BLKa and connected to a first word line. In operation S120, the first program operation is performed on a second memory cell arranged in the second memory block BLKb and connected to a second word line. In this case, the second word line may be arranged on the same level as the first word line, the first and second word lines may not be electrically connected to each other, and the first and second word lines may correspond to, for example, WL1 of FIG. 16. In operation S130, the second program operation is performed on the first memory cell arranged in the first memory block BLKa and connected to the first word line. In operation S140, the second program operation is performed on the second memory cell arranged in the second memory block BLKb and connected to the second word line.

In an exemplary embodiment of the inventive concept, an operation of performing the first program operation on third memory cells arranged in the first memory block BLKa and connected to a third word line, and an operation of performing the first program operation on fourth memory cells arranged in the second memory block BLKb and connected to a fourth word line, may be further provided between operation S120 and operation S130. In this case, the third and fourth word lines may be arranged on the same level, may be vertically adjacent to the first and second word lines, and may both correspond to, for example, the WL2 of FIG. 16.

In an exemplary embodiment of the inventive concept, an operation of performing the first program operation on fifth memory cells arranged in the first memory block BLKa and connected to a fifth word line, and an operation of performing the first program operation on sixth memory cells arranged in the second memory block BLKb and connected to a sixth word line, may be further provided after operation S140. Next, an operation of performing the second program operation on the third memory cells arranged in the first memory block BLKa and connected to the third word line, and an operation of performing the second program operation on the fourth memory cells arranged in the second memory block BLKb and connected to the fourth word line, may be further provided. In this case, the fifth and sixth word lines may be arranged on the same level, may be vertically adjacent to the third and fourth word lines, and may both correspond to, for example, the WL3 of FIG. 16.

Figure 17:
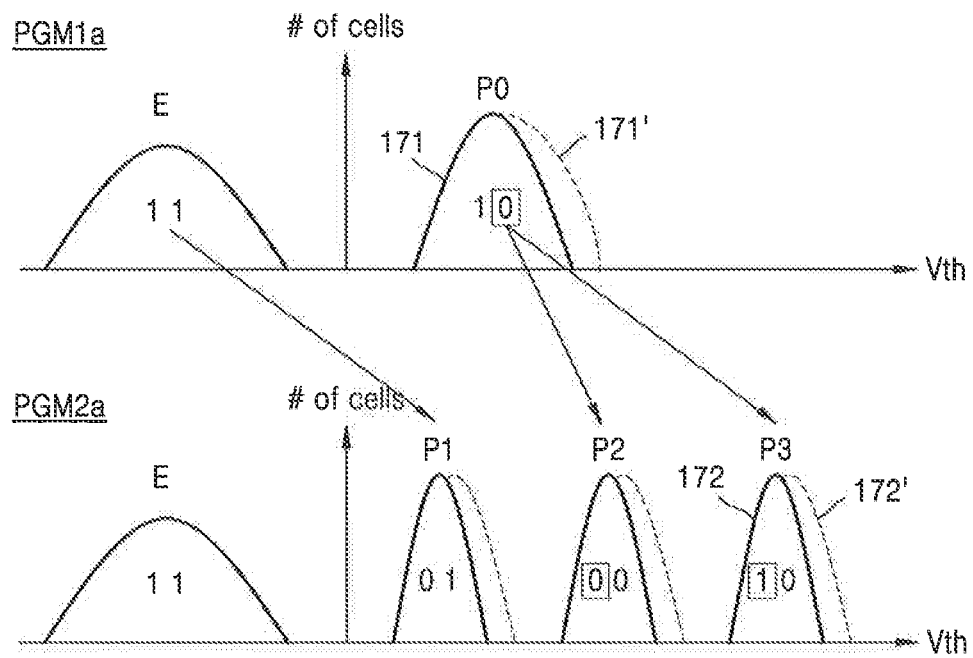
FIG. 17 illustrates first and second program operations according to an exemplary embodiment of the inventive concept.

FIG. 17 illustrates first and second program operations PGM1a and PGM2a according to an exemplary embodiment of the inventive concept. A programming method including the first and second program operations PGM1a and PGM2a shown in FIG. 17 may be referred to as a shadow programming method. Although FIG. 17 illustrates examples of first and second program operations PGM1a and PGM2a with respect to an MLC, the method described in FIG. 17 may be identically applied to a TLC or a QLC.

The first program operation PGM1a may program memory cells in an erase state to one of M program states (e.g., P0), where M is an integer equal to or greater than 2. An initial program distribution 171 may be changed to a program distribution 171' by coupling or interference according to program operations of peripheral memory cells. The second program operation PGM2a may program the memory cells on which the first program operation PGM1a is performed, to one of N program states (e.g., P1, P2 and P3), where N is an integer greater than M. An initial program distribution 172 may be changed to a program distribution 1721 by coupling or interference according to program operations of peripheral memory cells.

Figure 18:
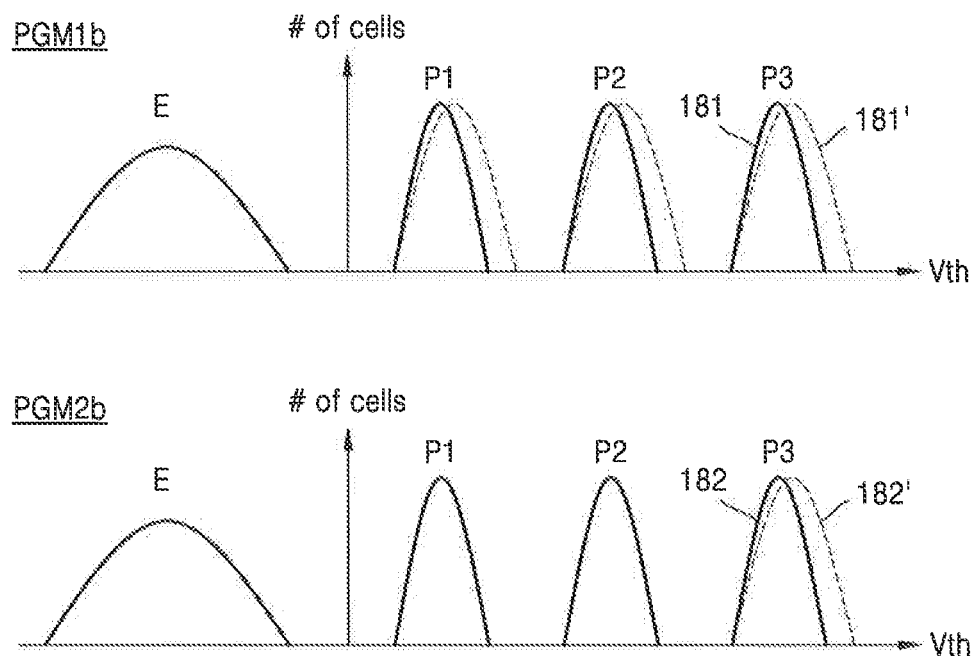
FIG. 18 illustrates first and second program operations according to an exemplary embodiment of the inventive concept.

FIG. 18 illustrates first and second program operations PGM1b and PGM2b according to an exemplary embodiment of the inventive concept. A programming method including the first and second program operations PGM1b and PGM2b shown in FIG. 18 may be referred to as a reprogram method. Although FIG. 18 illustrates examples of the first and second program operations with respect to an MLC, the method described in FIG. 18 may be identically applied to a TLC or a QLC.

The first program operation PGM1b may program memory cells in an erase state to one of N program states, where N is an integer equal to or greater than 2. An initial program distribution 181 may be changed to a program distribution 181' by coupling or interference according to the program operations of peripheral memory cells. The second program operation PGM2b may program the memory cells on which the first program operation PGM1b is performed, to one of N program states. An initial program distribution 182 may be changed to a program distribution 182' by coupling or interference according to the program operations of peripheral memory cells.

FIG. 19 illustrates a block interleaving programming method according to an exemplary embodiment of the inventive concept.

Referring to FIG. 19, the present embodiment may correspond to a first scramble method and may be a top-to-bottom (T2B) programming method that performs a program in an order from memory cells adjacent to a bit line to memory cells adjacent to a common source line. In this case, the same reference numeral is assigned to word lines arranged on the same level for convenience of explanation, but among the word lines arranged on the same level, the word line connected to the first memory block BLKa and the word line connected to the second memory block BLKb may not be electrically connected to each other. For example, as illustrated in FIG. 8, the word lines WL1a to WL8a and first to fourth string selection lines SSL1a, SSL2a, SSL3a and SSL4a may be connected to the first memory block BLKa, and the word lines WL1b to WL8b and first to fourth string selection lines SSL1b, SSL2b, SSL3b and SSL4b may be connected to the second memory block BLKb.

According to the present embodiment, the first program operation PGM1 may be sequentially performed on memory cells connected to the eighth word line WL8 and the first string selection line SSL1a (1), memory cells connected to the eighth word line WL8 and the first string selection line SSL1b (2), memory cells connected to the eighth word line WL8 and the second string selection line SSL2a (3), memory cells connected to the eighth word line WL8 and the second string selection line SSL2b (4), memory cells connected to the eighth word line WL8 and the third string selection line SSL3a (5), memory cells connected to the eighth word line WL8 and the third string selection line SSL3b (6), memory cells connected to the eighth word line WL8 and the fourth string selection line SSL4a (7), and memory cells connected to the eighth word line WL8 and the fourth string selection line SSL4b (8).

Next, the first program operation PGM1 may be sequentially performed on memory cells connected to the seventh word line WL7 and the first string selection line SSL1a (9), memory cells connected to the seventh word line WL7 and the first string selection line SSL1b (10), memory cells connected to the seventh word line WL7 and the second string selection line SSL2a (11), memory cells connected to the seventh word line WL7 and the second string selection line SSL2b (12), memory cells connected to the seventh word line WL7 and the third string selection line SSL3a (13), memory cells connected to the seventh word line WL7 and the third string selection line SSL3b (14), memory cells connected to the seventh word line WL7 and the fourth string selection line SSL4a (15), and memory cells connected to the seventh word line WL7 and the fourth string selection line SSL4b (16).

Next, a second program operation PGM2 may be sequentially performed on the memory cells connected to the eighth word line WL8 and the first string selection line SSL1a (17), the memory cells connected to the eighth word line WL8 and the first string selection line SSL1b (18), the memory cells connected to the eighth word line WL8 and the second string selection line SSL2a (19), the memory cells connected to the eighth word line WL8 and the second string selection line SSL2b (20), the memory cells connected to the eighth word line WL8 and the third string selection line SSL3a (21), the memory cells connected to the eighth word line WL8 and the third string selection line SSL3b (22), the memory cells connected to the eighth word line WL8 and the fourth string selection line SSL4a (23), and the memory cells connected to the eighth word line WL8 and the fourth string selection line SSL4b (24).

As such, according to the present embodiment, before the second program operation PGM2 is performed on the memory cells connected to the eighth word line WL8 and the first string selection line SSL1a, the first program operation PGM1 is performed on the memory cells connected to the seventh word line WL7 and the fourth string selection line SSL4b. Accordingly, the memory cells connected to the eighth word line WL8 and the first string selection line SSL1a may maintain the voltage difference between the word line and the channel for a sufficiently long time, after the first program operation PGM1. Accordingly, as a channel trap state of a cell string during a verify operation and a channel trap state of a cell string during a read operation are the same, a distribution of a memory device may be improved. Furthermore, as the time between the first program operation PGM1 and the second program operation PGM2 extends, influence due to a shallow trap may be reduced.

Figure 20:
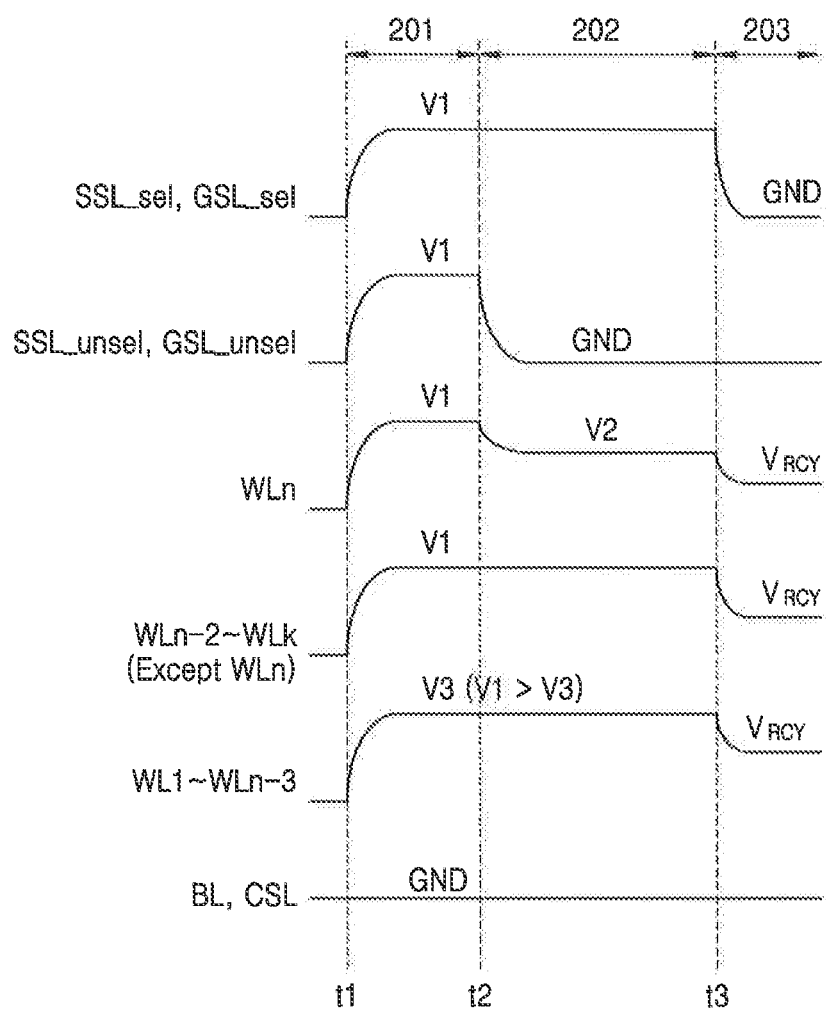
FIG. 20 illustrates bias conditions for a memory block for a time between the first program operation and the second program operation, according to the programming method of FIG. 19, according to an exemplary embodiment of the inventive concept.

FIG. 20 illustrates bias conditions for a memory block for a time between the first program operation and the second program operation, according to the programming method of FIG. 19, according to an exemplary embodiment of the inventive concept.

Referring to FIG. 20, bias conditions according to the present embodiment may correspond to modified examples of the bias conditions of FIG. 13, and the descriptions provided with reference to FIG. 13 may be applied to the present embodiment. According to the present embodiment, bias conditions for a selected word line WLn, upper unselected word lines WLn–2 to WLk, except the selected word line WLn, and lower unselected word lines WL1 to WLn–3 may be different from one another. For example, WLk may correspond to the uppermost word line, and WL1 may correspond to the lowermost word line.

In a first period 201, the first bias voltage V1 may be applied to the selected word line WLn and the upper unselected word lines WLn–2 to WLk except the selected word line Win, and a third bias voltage V3 that is lower than the first bias voltage V1 may be applied to the lower unselected word lines WL1 to WLn–3. In a second period 202, the second bias voltage V2 lower than the first bias voltage V1 may be applied to the selected word line WLn, the first bias voltage V1 may keep being applied to the upper unselected word lines WLn–2 to WLk except the selected word line WLn, and the third bias voltage V3 may keep being applied to the lower unselected word lines WL1 to WLn–3. In a third period 203, the recovery voltage $V_{RCY}$ may be applied to the selected word line WLn, the upper unselected word lines WLn–2 to WLk except the selected word line WLn, and the lower unselected word lines WL1 to WLn–3.

FIG. 21 illustrates a block interleaving programming method according to an exemplary embodiment of the inventive concept. Referring to FIG. 21, the programming method according to the present embodiment may correspond to a modified example of the T2B programming method of FIG. 19, that is, a bottom-to-top (B2T) programming method for performing a program in an order from memory cells adjacent to a common source line to memory cells adjacent to a bit line.

According to the present embodiment, the first program operation PGM1 may be sequentially performed by the block interleaving programming method on memory cells connected to the first word line WL1 of the first and second memory blocks BLKa and BLKb. Next, the first program operation PGM1 may be sequentially performed by the block interleaving programming method on memory cells connected to the second word line WL2 of the first and second memory blocks BLKa and BLKb. Next, the second program operation PGM2 may be sequentially performed by the block interleaving programming method on memory cells connected to the first word line WL1 of the first and second memory blocks BLKa and BLKb. Next, the first program operation PGM1 may be sequentially performed by the block interleaving programming method on memory cells connected to the third word line WL3 of the first and second memory blocks BLKa and BLKb. Next, the second program operation PGM2 may be sequentially performed by the block interleaving programming method on memory cells connected to the second word line WL2 of the first and second memory blocks BLKa and BLKb. The sequence of the program operations can be gleaned from numerals 140 in FIG. 21.

As such, according to the present embodiment, before the second program operation PGM2 is performed on the memory cells connected to the first word line WL1 and the first string selection line SSL1a, by performing the first program operation PGM1 on the memory cells connected to the second word line WL2 and the fourth string selection line SSL4b, the memory cells connected to the first word line WL1 and the first string selection line SSL1a may maintain a voltage difference for a sufficiently long time between the word line and the channel after the first program operation PGM1.

Figure 22:
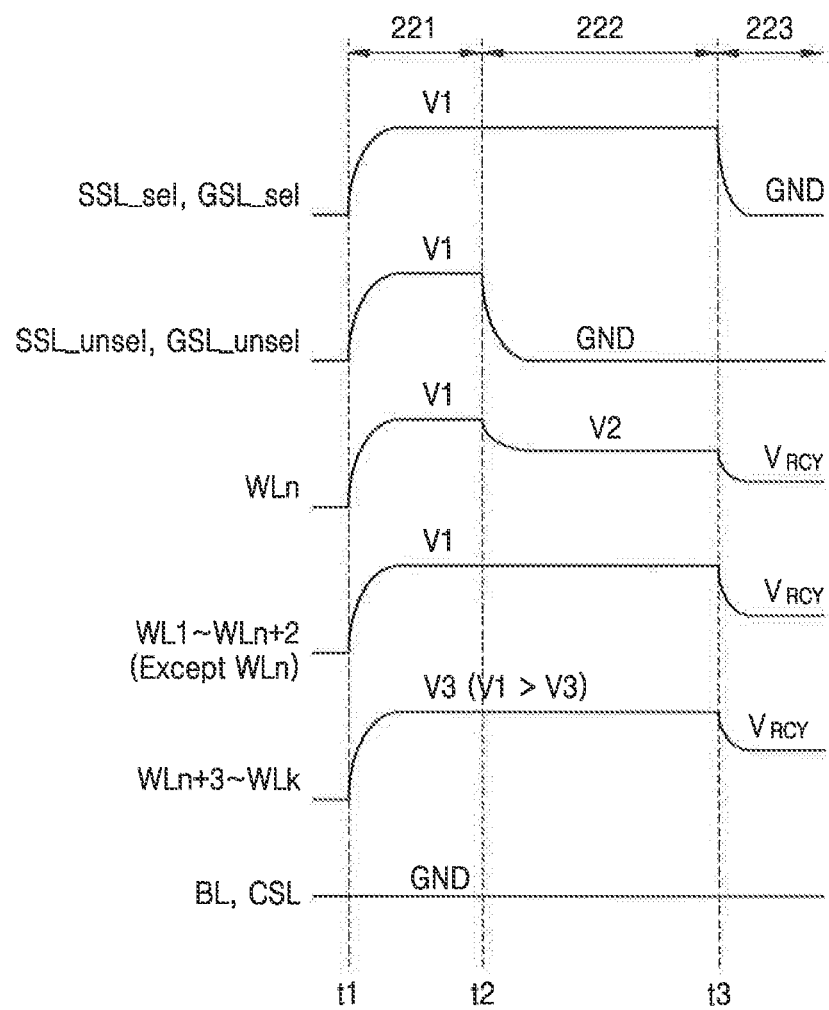
FIG. 22 illustrates bias conditions for a memory block for a time between the first program operation and the second program operation, according to the programming method of FIG. 20, according to an exemplary embodiment of the inventive concept.

FIG. 22 illustrates bias conditions for a memory block for a time between the first program operation and the second program operation, according to the programming method of FIG. 20, according to an exemplary embodiment of the inventive concept.

Referring to FIG. 22, bias conditions according to the present embodiment may correspond to a modified example of the bias conditions of FIG. 20, and the descriptions provided with reference to FIG. 20 may be applied to the present embodiment. According to the present embodiment, bias conditions for the selected word line WLn, the lower unselected word lines WL1 to WLn+2, except the selected word line WLn, and the upper unselected word lines WLn+3 to WLk may be different from one another.

In a first period 221, the first bias voltage V1 may be applied to the selected word line WLn and the lower unselected word lines WL1 to WLn+2 except the selected word line WLn, and the third bias voltage V3 that is lower than the first bias voltage V1 may be applied to the upper unselected word lines WLn+3 to WLk. In a second period 222, the second bias voltage V2 lower than the first bias voltage V1 may be applied to the selected word line the first bias voltage V1 may keep being applied to the lower unselected word lines WL1 to WLn+2 except the selected word line WLn, and the third bias voltage V3 may keep being applied to the upper unselected word lines WLn+3 to WLk. In a third period 223, the recovery voltage $V_{RCY}$ may be applied to the selected word line WLn, the lower unselected word lines WL1 to WLn+2 except the selected word line WLn, and the upper unselected word lines WLn+3 to WLk.

FIG. 23 illustrates a block interleaving programming method according to an exemplary embodiment of the inventive concept.

Referring to FIG. 23, the present embodiment may correspond to a second scramble method, and may be the T2B programming method that performs a program in an order from memory cells adjacent to a bit line to memory cells adjacent to a common source line. The programming method according to the present embodiment may be applied to the B2T programming method.

According to the present embodiment, the first program operation PGM1 may be sequentially performed by the block interleaving programming method on memory cells connected to the eighth word line WL8 of the first and second memory blocks BLKa and BLKb (e.g., 1-8). Next, the first program operation PGM1 may be sequentially performed on the memory cells connected to the seventh word line WL7 and the first string selection line SSL1a (e.g., 9), and the memory cells connected to the seventh word line WL7 and the first string selection line SSL1b (e.g., 10). Next, the second program operation PGM2 may be sequentially performed on the memory cells connected to the eighth word line WL8 and the first string selection line SSL1a (e.g., 11), and the memory cells connected to the eighth word line WL8 and the first string selection line SSL1b (e.g., 12).

Next, the first program operation PGM1 may be sequentially performed on the memory cells connected to the seventh word line WL7 and the second string selection line SSL2a (e.g., 13), and the memory cells connected to the seventh word line WL7 and the second string selection line SSL2b (e.g., 14). Next, the second program operation PGM2 may be sequentially performed the memory cells connected to the eighth word line WL8 and the second string selection line SSL2a (e.g., 15), and the memory cells connected to the eighth word line WL8 and the second string selection line SSL2b (e.g., 16).

As such, when a program operation is performed by the second scramble method, after the first program operation PGM1, whose program order is 10, is performed on the memory cells connected to the seventh word line WL7 and the first string selection line SSL1b, the second program operation PGM2 is performed on the memory cells connected to the eighth word line WL8 and the first string selection line SSL1a. Accordingly, the number of pages that a data input buffer has is 40 (=10*4) for the QLC. When a program operation is performed by the first scramble method of FIG. 19, after the first program operation PGM1, whose program order is 16, is performed on the memory cells connected to the seventh word line WL7 and the fourth string selection line SSL4b, the second program operation PGM2 is performed on the memory cells connected to the eighth word line WL8 and the fourth string selection line SSL4a, the number of pages that the data input buffer has is 64 (=16*4) for the QLC.

FIG. 24 illustrates a block interleaving programming method according to an exemplary embodiment of the inventive concept.

Referring to FIG. 24, the present embodiment may correspond to a modified example of the programming method of FIG. 19, and according to the present embodiment, a program may be performed by the block interleaving programming method on the first, second, and third memory blocks BLKa, BLKb, and BLKc. The programming method according to the present embodiment may be applied to the B2T programming method. In exemplary embodiments of the inventive concept, the program may be performed by the block interleaving programming method on four or more memory blocks.

According to the present embodiment, the first program operation PGM1 may be sequentially performed by the block interleaving programming method on memory cells connected to the eighth word line WL8 of the first to third memory blocks BLKa to BLKc (e.g., 1-12). Next, the first program operation PGM1 may be sequentially performed by the block interleaving programming method on memory cells connected to the seventh word line WL7 of the first to third memory blocks BLKa to BLKc (e.g., 13-24). Next, the second program operation PGM2 may be sequentially performed by the block interleaving programming method on memory cells connected to the eighth word line WL8 of the first to third memory blocks BLKa to BLKc (e.g., 25-36). Next, the first program operation PGM1 may be sequentially performed by the block interleaving programming method on memory cells connected to a sixth word line WL6 of the first to third memory blocks BLKa to BLKc (e.g., 37-48). Next, the second program operation PGM2 may be sequentially performed by the block interleaving programming method on memory cells connected to the seventh word line WL7 of the first to third memory blocks BLKa to BLKc (e.g., 49-60).

Figure 25:
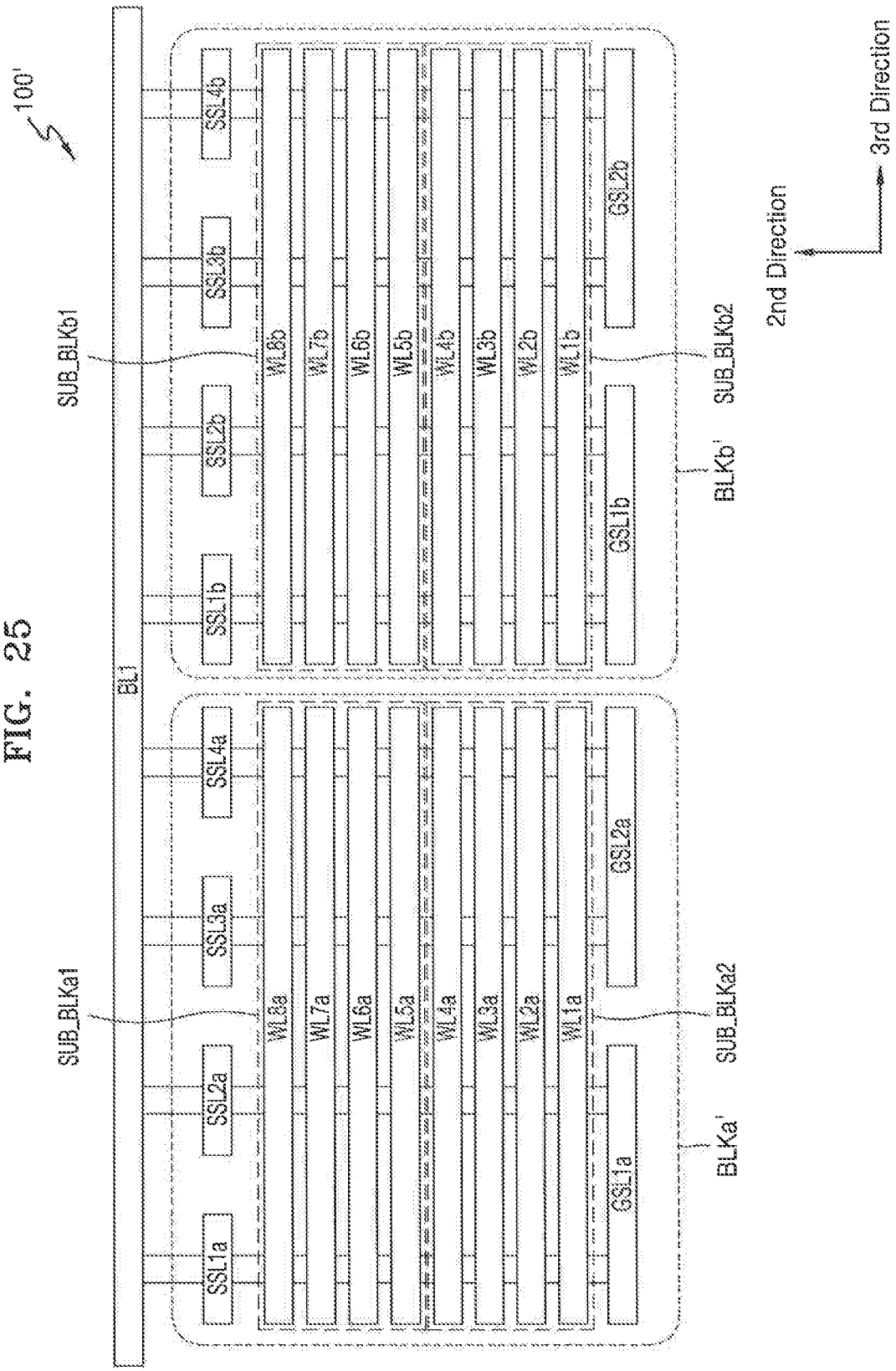
FIG. 25 illustrates a memory device including the first and second memory blocks, each including a plurality of sub-blocks, according to an exemplary embodiment of the inventive concept.

FIG. 25 illustrates a memory device 100' including first and second memory blocks BLKa' and BLKb', each including a plurality of sub-blocks, according to an exemplary embodiment of the inventive concept.

Referring to FIG. 25, the memory device 100' may include the first and second memory blocks BLKa' and BLKb'. The first memory block BLKa' may include first and second sub-blocks SUB_BLKa1 and SUB_BLKa2, and the second memory block BLKb' may include first and second sub-blocks SUB_BLKb1 and SUB_BLKb2.

Figure 26:
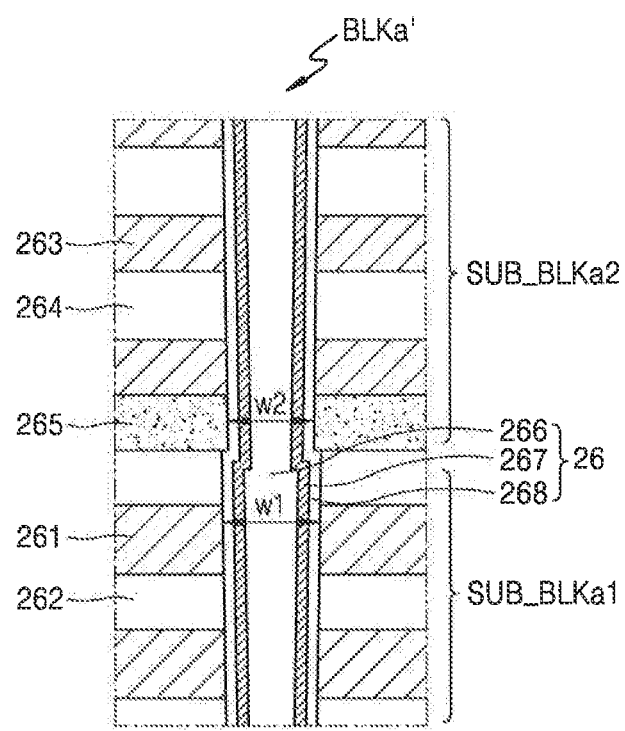
FIG. 26 is a cross-sectional view of the first memory block of FIG. 25, according to an exemplary embodiment of the inventive concept.

FIG. 26 is a cross-sectional view of the first memory block BLKa' of FIG. 25, according to an exemplary embodiment of the inventive concept.

Referring to FIGS. 25 and 26, to prevent a decrease of a diameter of a channel hole from an upper portion to a lower portion of the first memory block BLKa', an etch process for forming the channel hole may be performed at least twice. After a first sub-block SUB_BLKa1 is formed on the substrate SUB, a first etch process is performed, and then, a second sub-block SUB_BLKa2 may be formed on the first sub-block SUB_BLKa1 and the second etch process may be performed on the second sub-block SUB_BLKa2.

The first sub-block SUB_BLKa1 may include a gate electrode 261 and an insulating layer 262 that are alternately arranged in the second direction. The second sub-block SUB_BLKa2 may include a gate electrode 263 and an insulating layer 264 that are alternately arranged in the second direction. According to an exemplary embodiment of the inventive concept, an inter-structure layer 265 may be arranged between the first sub-block SUB_BLKa1 and the second sub-block SUB_BLKa2. Furthermore, a channel structure 26 may include a channel 267, a dielectric structure 268 surrounding an outer wall of the channel 267 and a channel burial film pattern 266 arranged in the channel 267. In this case, an upper diameter w2 of a channel hole formed in the second sub-block SUB_BLKa2 may be greater than a lower diameter w1 of a channel hole formed in the first sub-block SUB_BLKa1.

Figure 27:
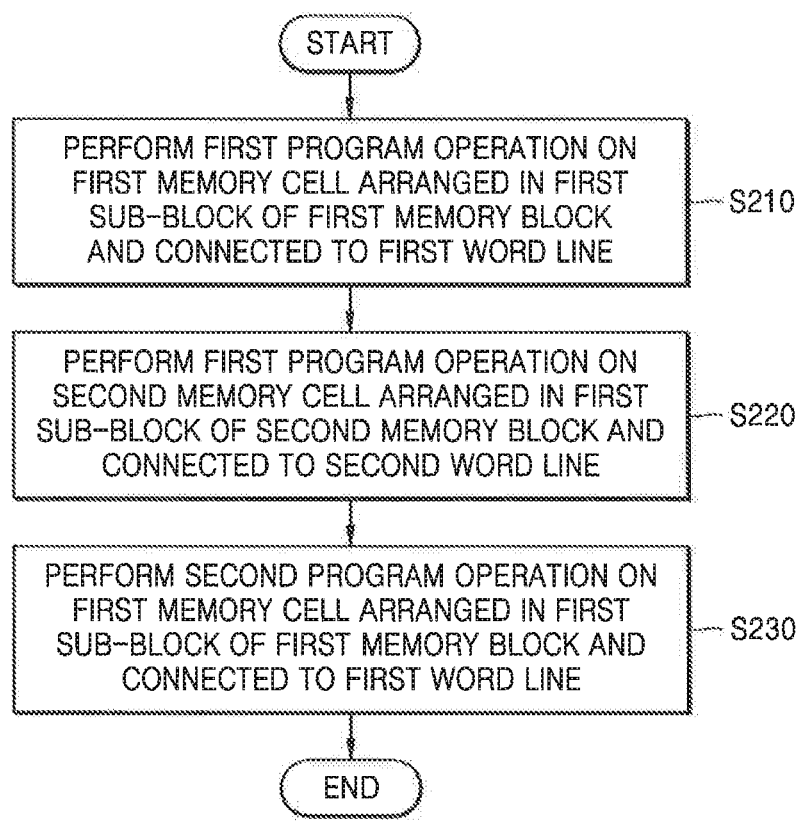
FIG. 27 is a flowchart of a method of programming a non-volatile memory device according to an exemplary embodiment of the inventive concept.

FIG. 27 is a flowchart of a method of programming a non-volatile memory device according to an exemplary embodiment of the inventive concept.

The present embodiment may correspond to a modified example of FIG. 15, and may include, for example, operations that are performed in the memory device 100' of FIG. 25 in a time-series method. In operation S210, the first program operation is performed on the first memory cell arranged in the first sub-block SUB_BLKa1 of the first memory block BLKa' and connected to the first word line. In operation S220, the first program operation is performed on the second memory cell arranged the first sub-block SUB_BLKb1 of the second memory block BLKb' and connected to the second word line. In operation S230, the second program operation is performed on the first memory cell arranged in the first sub-block SUB_BLKa1 of the first memory block BLKa' and connected to the first word line.

FIG. 28 illustrates an example of a block interleaving programming method according to the programming method of FIG. 27, according to an exemplary embodiment of the inventive concept.

Referring to FIGS. 25 and 28, the program may be performed by the B2T method on the first sub-block SUB_BLKa1 of the first memory block BLKa' and the first sub-block SUB_BLKb1 of the second memory block BLKb', and the program may be performed by the T2B method on the second sub-block SUB_BLKa2 of the first memory block BLKa' and the second sub-block SUB_BLKb2 of the second memory block BLKb'.

In an exemplary embodiment of the inventive concept, the first program operation PGM1 may be sequentially performed by the block interleaving programming method on memory cells connected to the fifth word line WL5 of the first sub-blocks SUB_BLKa1 and SUB_BLKb1 (e.g., 1-8). Next, the first program operation PGM1 may be sequentially performed by the block interleaving programming method on memory cells connected to the sixth word line WL6 of the first sub-blocks SUB_BLKa1 and SUB_BLKb1 (e.g., 9-16). Next, the second program operation PGM2 may be sequentially performed by the block interleaving programming method on memory cells connected to the fifth word line WL5 of the first sub-blocks SUB_BLKa1 and SUB_BLKb1 (e.g., 17-24).

In an exemplary embodiment of the inventive concept, the first program operation PGM1 may be sequentially performed by the block interleaving programming method on memory cells connected to a fourth word line VIA of the second sub-blocks SUB_BLKa2 and SUB_BLKb2 (e.g., 1-8). Next, the first program operation PGM1 may be sequentially performed by the block interleaving programming method on memory cells connected to the third word line WL3 of the second sub-blocks SUB_BLKa2 and SUB_BLKb2 (e.g., 9-16). Next, the second program operation PGM2 may be sequentially performed by the block interleaving programming method on memory cells connected to the fourth word line WL4 of the second sub-blocks SUB_BLKa2 and SUB_BLKb2 (e.g., 17-24).

However, the inventive concept is not limited thereto, and in an exemplary embodiment, the program may be performed by the T2B method on both of the first sub-blocks SUB_BLKa1 and SUB_BLKb1 and the second sub-blocks SUB_BLKa2 and SUB_BLKb2. In another exemplary embodiment of the inventive concept, the program may be performed by B2T method on both of the first sub-blocks SUB_BLKa1 and SUB_BLKb1 and the second sub-blocks SUB_BLKa2 and SUB_BLKb2. Furthermore, although FIG. 28 illustrates a programming method according to the first scramble method, the program may be performed by the second scramble method illustrated in FIG. 23 on the memory device 100'.

Figure 29:
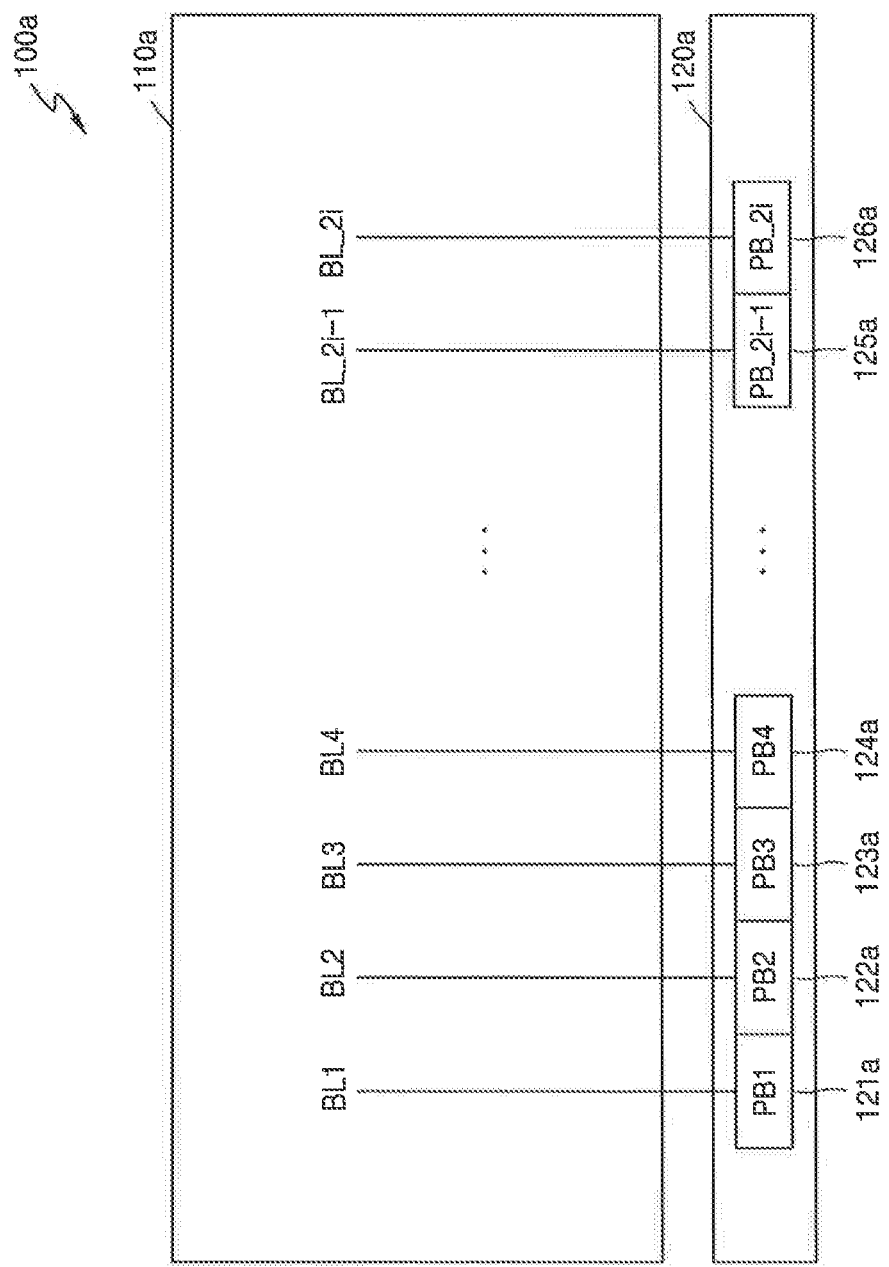
FIG. 29 illustrates a memory device including a page buffer unit having an all bit line (ABL) structure, according to an exemplary embodiment of the inventive concept.

FIG. 29 illustrates a memory device 100a including a page buffer unit 120a having an all bit line (ABL) structure, according to an exemplary embodiment of the inventive concept.

Referring to FIG. 29, a memory cell array 110a may be connected to bit lines BL1 to BL_2i, where i is an integer equal to or greater than 3. The page buffer unit 120a may include page buffers 121a to 126a. Each of the bit lines BL1 to BL_2*i* may be connected to one page buffer, and thus, the page buffer unit 120*a* may be referred to as a page buffer of an ABL structure. According to the present embodiment, a program operation may be simultaneously performed on memory cells connected to the same word line and the same string selection line.

Figure 30:
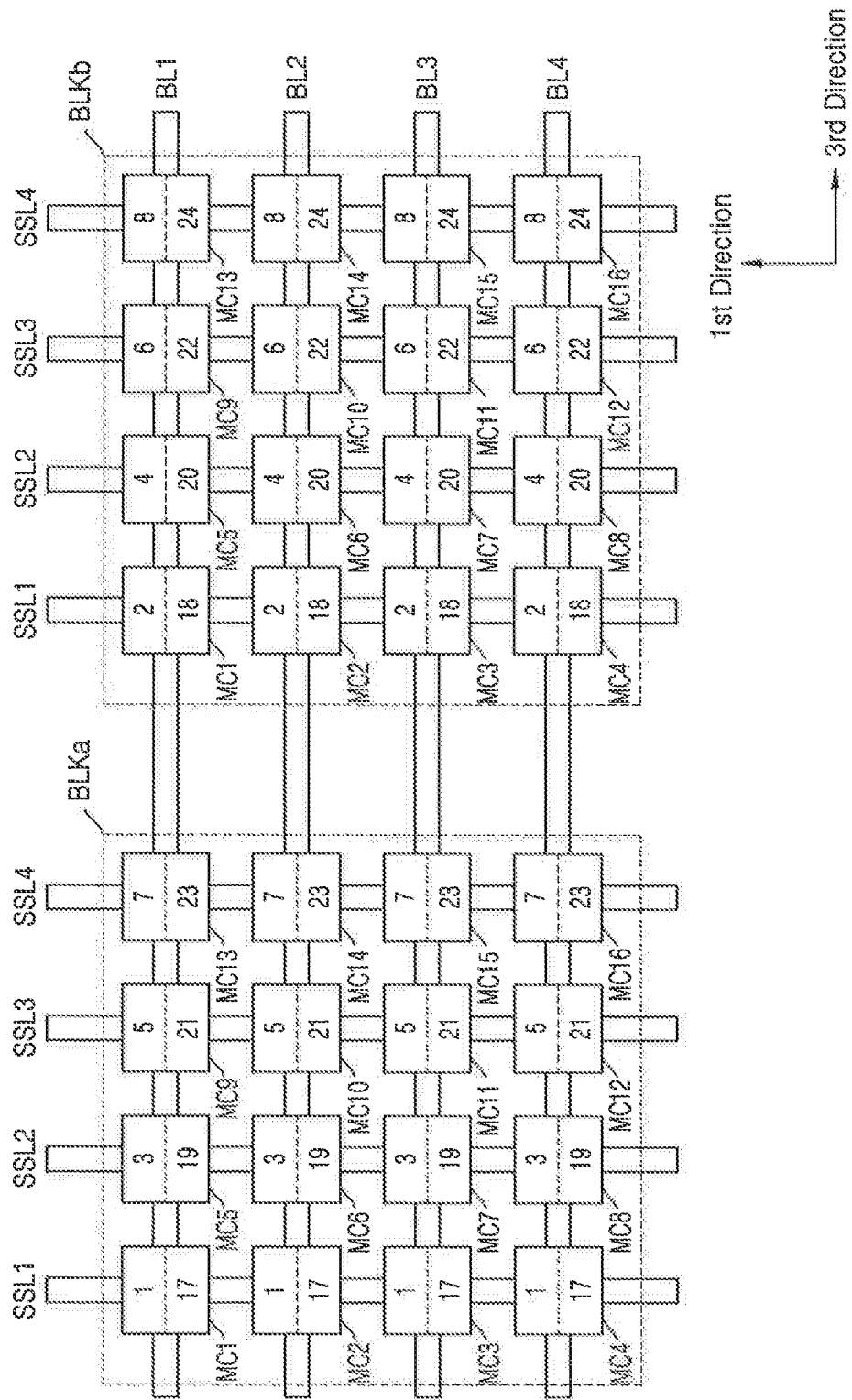
FIG. 30 illustrates an example of a block interleaving programming method performed in the memory device of FIG. 29, according to an exemplary embodiment of the inventive concept.

FIG. 30 illustrates an example of a block interleaving programming method performed in the memory device 100*a* of FIG. 29, according to an exemplary embodiment of the inventive concept.

Referring to FIG. 30, first to sixteenth memory cells MC1, MC2, MC3, MC4, MC5, MC6, MC7, MC8, MC9, MC10, MC11, MC12, MC13, MC14, MC15 and MC16 included in the first memory block BLKa and the first to sixteenth memory cells MC1 to MC16 included in the second memory block BLKb each may be connected to word lines arranged on the same level. The programming method according to the present embodiment may be substantially the same as, for example, that of FIG. 19, and thus, a detailed description thereof is omitted. For example, the numbers 1-24 in the first and second memory blocks BLKa and BLKb may correspond to those described with reference to FIG. 19. FIG. 30 further shows that the first to sixteenth memory cells MC1 to MC16 of the first and second memory blocks BLKa and BLKb are connected first to fourth bit lines BL1, BL2, BL3 and BL4, and first to fourth string selection lines SL1, SL2, SL3 and SL4.

Figure 31:
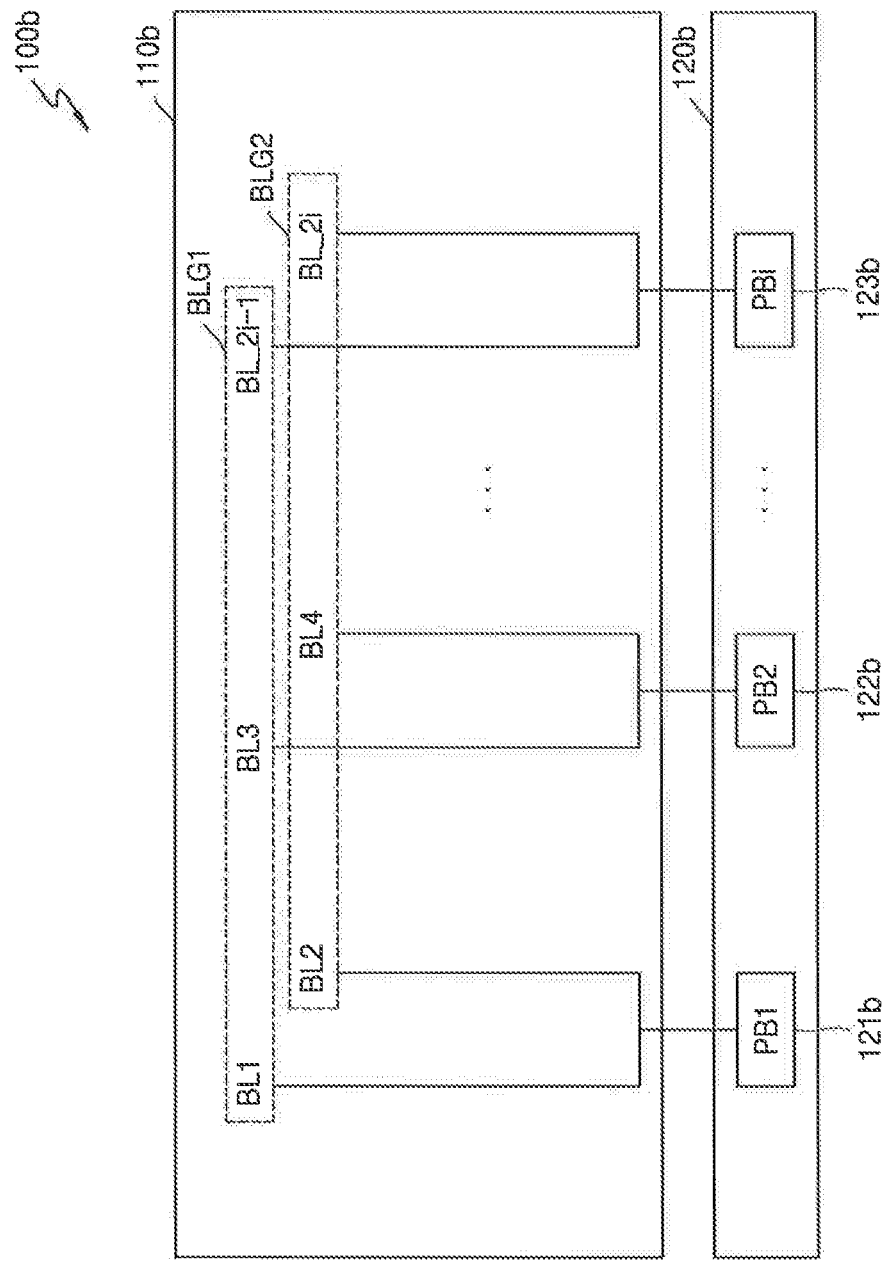
FIG. 31 illustrates a memory device including a page buffer unit having a shielded bit line (SBL) structure, according to an exemplary embodiment of the inventive concept.

FIG. 31 illustrates a memory device 100*b* including a page buffer unit 120*b* having a shielded bit line (SBL) structure, according to an exemplary embodiment of the inventive concept.

Referring to FIG. 31, a memory cell array 110*b* may be connected to the bit lines BL1 to BL_2*i*, where i is an integer equal to or greater than 3. The page buffer unit 120*b* may include page buffers 121*b* to 123*b*. Two bit lines may be connected to one page buffer, and thus, the page buffer unit 120*b* may be referred to as a page buffer of an SBL structure.

In the present embodiment, the bit lines BL1 to BL_2*i* may be divided into first and second bit line groups BLG1 and BLG2, and the program orders of the first and second bit line groups BLG1 and BLG2 may be different from each other. For example, the program operation may be performed on memory cells connected to the same word line, the same string selection line, and the first bit line group BLG1. Next, the program operation may be performed on memory cells connected to the same word line, the same string selection line, and the second bit line group BLG2.

Figure 32:
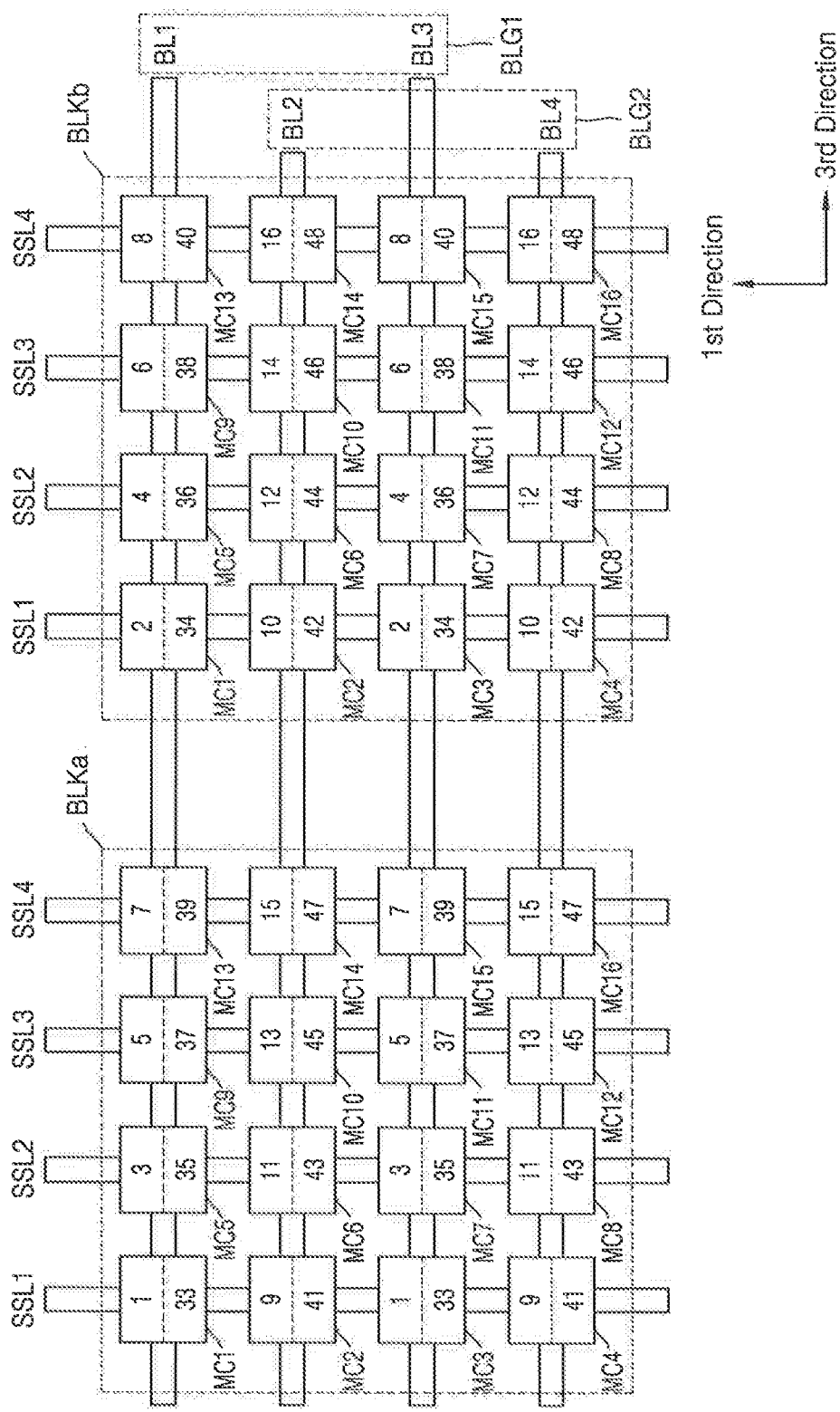
FIG. 32 illustrates an example of a block interleaving programming method performed in the memory device of FIG. 31, according to an exemplary embodiment of the inventive concept.

FIG. 32 illustrates an example of a block interleaving programming method preformed in the memory device 100*b* of FIG. 31, according to an exemplary embodiment of the inventive concept.

Referring to FIG. 32, the first to sixteenth memory cells MC1 to MC16 included in the first memory block BLKa and the first to sixteenth memory cells MC1 to MC16 included in the second memory block BLKb each may be connected to word lines arranged on the same level. According to the present embodiment, the first program operation may be sequentially performed by the block interleaving programming method on memory cells connected to the first hit line group BLG1 of the first and second memory blocks BLKa and BLKb. Next, the first program operation may be sequentially performed by the block interleaving programming method on memory cells connected to the second bit line group BLG2 of the first and second memory blocks BLKa and BLKb. Next, the second program operation may be sequentially performed by the block interleaving programming method on the memory cells connected to the first bit line group BLG1 of the first and second memory blocks BLKa and BLKb.

Figure 33:
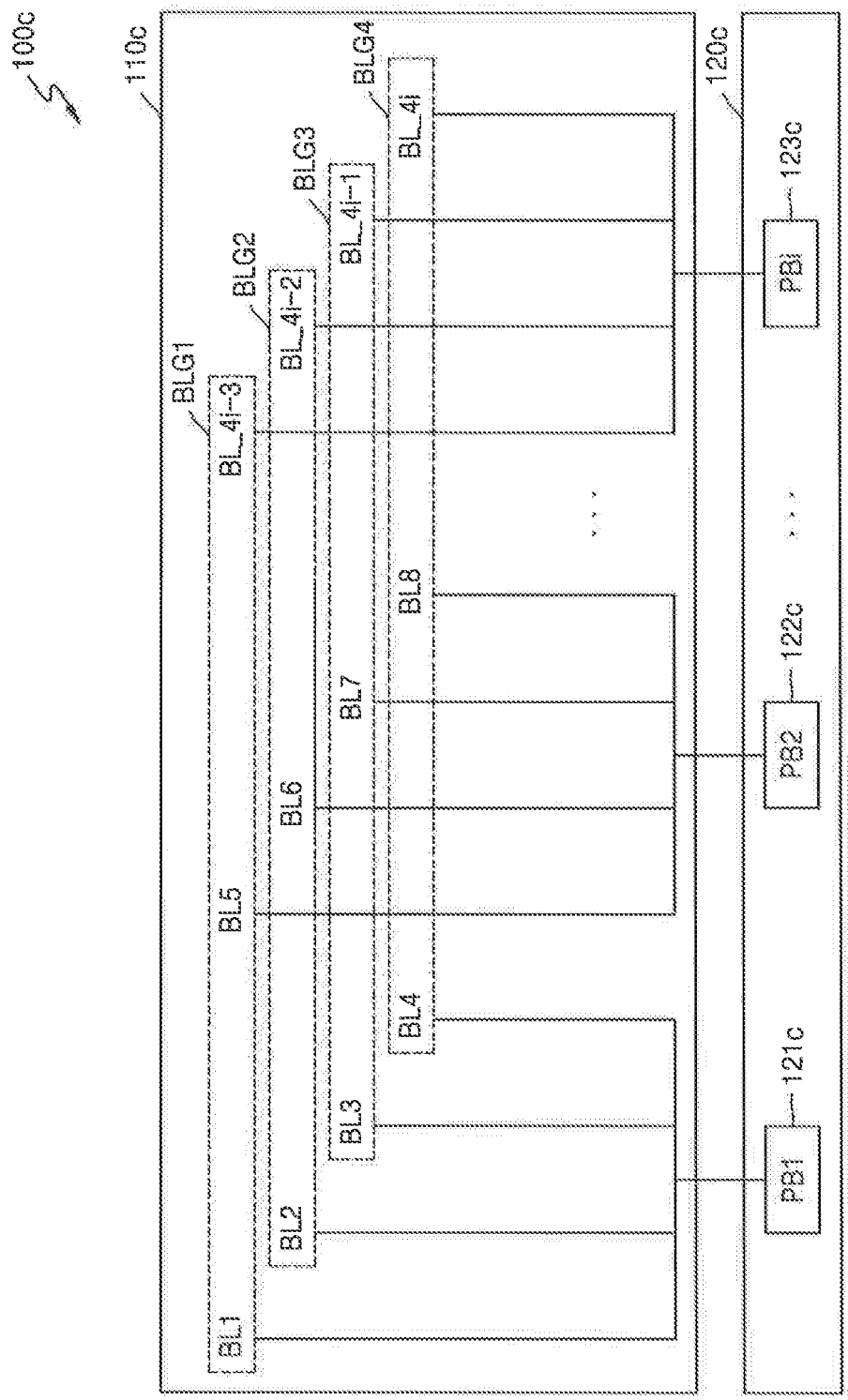
FIG. 33 illustrates a memory device including a page buffer unit having a quadruple bit line (QBL) structure, according to an exemplary embodiment of the inventive concept.

FIG. 33 illustrates a memory device 100*c* including a page buffer unit 120*c* having a quadruple bit lane (QBL) structure, according to an exemplary embodiment of the inventive concept.

Referring to FIG. 33, a memory cell array 110*c* may be connected to bit lines BL1 to BL_4*i*, where i is an integer equal to or greater than 3. The page buffer unit 120*c* may include page buffers 121*c* to 123*c*. Four bit lines may be connected to one page buffer, and thus, the page buffer unit 120*c* may be referred to as a page buffer of a QBL structure.

In the present embodiment, the bit lines BL1 to BL_4*i* may be divided into first to fourth bit line groups BLG1 to BLG4, and the program orders of the first to fourth bit line groups BLG1 to BLG4 may be different from one another. For example, the program operation may be performed on memory cells connected to the same word line, the same string selection line, and the first bit line group BLG1. Next, the program operation may be performed on memory cells connected to the same word line, the same string selection line, and the second bit line group BLG2. Next, the program operation may be performed on memory cells connected to the same word line, the same string selection line, and the third bit line group BLG3. Next, the program operation may be performed on memory cells connected to the same word line, the same string selection line, and the fourth bit line group BLG4.

Figure 34:
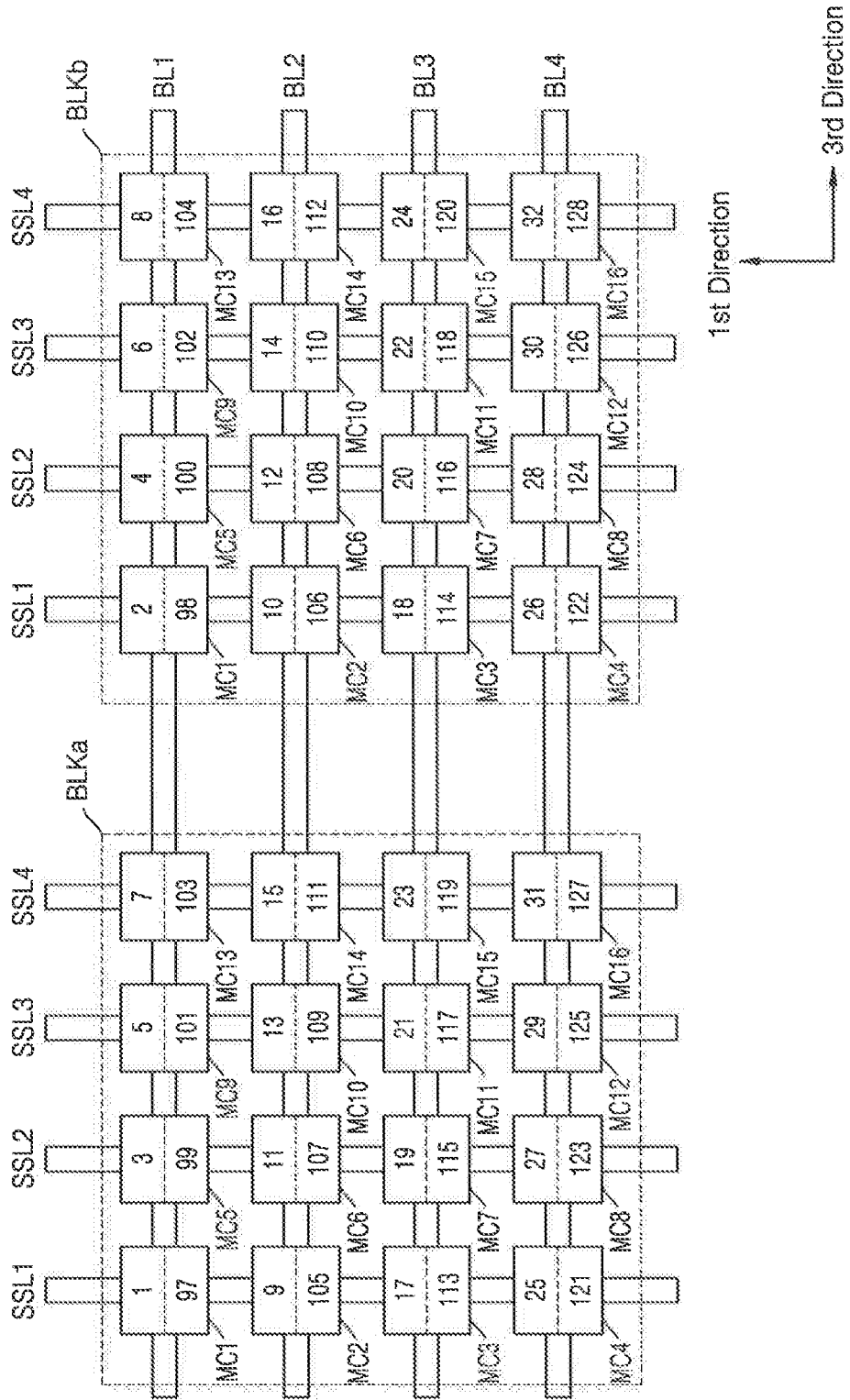
FIG. 34 illustrates an example of a block interleaving programming method performed in the memory device of FIG. 33, according to an exemplary embodiment of the inventive concept.

FIG. 34 illustrates an example of a block interleaving programming method performed in the memory device 100*c* of FIG. 33, according to an exemplary embodiment of the inventive concept.

Referring to FIG. 34, the first to sixteenth memory cells MC1 to MC16 included in the first memory block BLKa and the first to sixteenth memory cells MC1 to MC16 included in the second memory block BLKb each may be connected to word lines arranged on the same level. According to the present embodiment, the first program operations may be sequentially performed by the block interleaving programming method on the memory cells connected to the first bit line group BLG1 of the first and second memory blocks BLKa and BLKb. Next, the first program operations may be sequentially performed by the block interleaving programming method on the memory cells connected to the second bit line group BLG2 of the first and second memory blocks BLKa and BLKb. Next, the first program operations may be sequentially performed by the block interleaving programming method on memory cells connected to the third bit line group BLG3 of the first and second memory blocks BLKa and BLKb. Next, the first program operations may be sequentially performed by the block interleaving programming method on memory cells connected to the fourth bit line group BLG4 of the first and second memory blocks BLKa and BLKb. Next, the second program operations may be sequentially performed by the block interleaving programming method on the memory cells connected to the first bit line group BLG1 of the first and second memory blocks BLKa and BLKb. The program operations are denoted by the numbers 1-128 in FIG. 34, for example.

Figure 35:
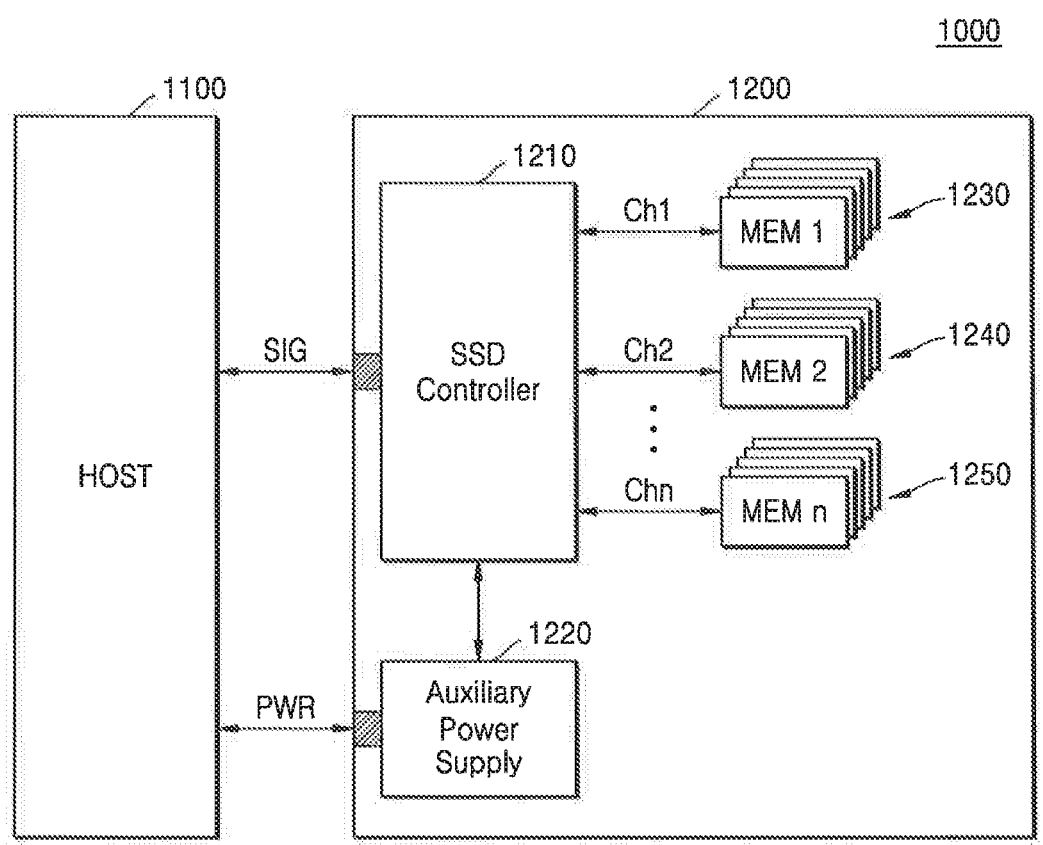
FIG. 35 illustrates a solid state drive (SSD) system according to an exemplary embodiment of the inventive concept.

FIG. 35 illustrates a solid state drive (SSD) system 1000 adopting the memory devices according to the above described exemplary embodiments of the inventive concept.

Referring to FIG. 35, the SSD system 1000 may include a host 1100 and an SSD 1200. The SSD 1200 may exchange signals SIG with the host 1100 via a signal connector, and receive an input of power PWR through a power connector.

The SSD 1200 may include an SSD controller 1210, an auxiliary power supply 1220, and memory devices 1230, 1240, and 1250. The memory devices 1230, 1240, and 1250 may be vertically stacked NAND flash memory devices. In this regard, the SSD 1200 may be embodied by using the embodiments described with reference to FIGS. 1 to 34.

While the inventive concept has been particularly shown and described with reference to exemplary embodiments thereof, it will be understood by one of ordinary skill in the art that various changes in form and details may be made therein without departing from the spirit and scope of the inventive concept as defined by the following claims.

What is claimed is:

1. A method of programming a non-volatile memory device including a first memory block and a second memory block, the method comprising:
   performing a first program operation on a first memory cell in the first memory block and connected to a first word line of a first level with respect to a substrate;
   after the performing of the first program operation on the first memory cell, performing the first program operation on a second memory cell in the second memory block and connected to a second word line of the first level; and
   after the performing of the first program operation on the second memory cell, performing a second program operation on the first memory cell.

2. The method of claim 1, further comprising, after the performing of the first program operation on the first memory cell, applying a first bias voltage having a voltage level higher than a ground voltage to the first word line, in a first dummy period.

3. The method of claim 2, further comprising applying a second bias voltage higher than the first bias voltage to unselected word lines connected to the first memory block, and applying a turn-on voltage to a string selection line and a ground selection line connected to the first memory cell, in the first dummy period.

4. The method of claim 2, wherein, in a delay period between the first dummy period and the second program operation, a voltage difference between a channel corresponding to the first memory cell and the first word line maintains a value greater than 0 V.

5. The method of claim 2, further comprising performing a program recovery operation on the first memory cell during a first recovery time after the first dummy period.

6. The method of claim 5, further comprising applying a first recovery voltage to the first word line and unselected word lines connected to the first memory block, and applying a turn-off voltage to a string selection line and a ground selection line connected to the first memory cell, during the first recovery time.

7. The method of claim 2, further comprising, after the performing of the second program operation on the first memory cell, applying a third bias voltage having a voltage level higher than the ground voltage to the first word line, in a second dummy period.

8. The method of claim 7, further comprising applying a second recovery voltage to the first word line and unselected word lines connected to the first memory block, during a second recovery time after the second dummy period.

9. The method of claim 1, further comprising, after the performing of the second program operation on the first memory cell, performing the second program operation on the second memory cell.

10. The method of claim 1, further comprising:
    after the performing of the first program operation on the second memory cell, performing the first program operation on a third memory cell in the first memory block and connected to a third word line of a second level vertically adjacent to the first level; and
    after the performing of the first program operation on the third memory cell, performing the first program operation on a fourth memory cell in the second memory block and connected to a fourth word line of the second level,
    wherein the second program operation on the first memory cell is performed after the performing of the first program operation on the fourth memory cell.

11. The method of claim 1, wherein the non-volatile memory device further comprises a third memory block, the method further comprising:
    after the performing of the first program operation on the second memory cell and before the performing of the second program operation on the first memory cell, performing the first program operation on a third memory cell in the third memory block and connected to a third word line of the first level.

12. The method of claim 1, wherein each of the first and second program operations comprises a plurality of program loops that are sequentially performed, and each of the plurality of program loops comprises a program period and a verify period.

13. The method of claim 1, wherein the first and second program operations on the first memory cell correspond to program operations to write first data to the first memory cell.

14. The method of claim 1, wherein the first program operation on the first memory cell comprises programming the first memory cell to one of M program states,
    the second program operation on the first memory cell comprises programming the first memory cell to one of N program states, and
    M and N are natural numbers and N is greater than M.

15. The method of claim 1, wherein the first program operation on the first memory cell comprises programming the first memory cell to one of N program states,
    the second program operation on the first memory cell comprises reprogramming the first memory cell to one of N program states, and
    N is a natural number.

16. A method of programming a non-volatile memory device including a first memory block and a second memory block, the method comprising:
    performing a first program operation on a first memory cell, wherein the first memory cell is connected to a first word line, the first memory block, and a first string selection line;
    performing the first program operation on a second memory cell, wherein the second memory cell is connected to a second word line, the second memory block, and a second string selection line;
    performing the first program operation on a third memory cell connected to the first word line and a third string selection line;
    performing the first program operation on a fourth memory cell connected to the second word line and a fourth string selection line; and
    performing a second program operation on the first memory cell,
    wherein the first and second word lines are arranged on a same level with respect to a substrate, and the first, second, third and fourth string selection lines are arranged on a same level above the first and second word lines.

17. A method of programming a non-volatile memory device including a first memory block and a second memory block, the method comprising:
performing a first program operation on a selected word line of the first memory block;
performing the first program operation on a selected word line of the second memory block, wherein the first program operation on the selected word line of the second memory block overlaps with a delay operation performed on the selected word line of the first memory block;
performing a second program operation on the selected word line of the first memory block, wherein the second program operation overlaps with a delay operation performed on the selected word line of the second memory block; and
performing the second program operation on the selected word line of the second memory block.

18. The method of claim 17, wherein the delay operation performed on the selected word line of the second memory block occurs between the performing of the first program operation on the selected word line of the second memory block and the performing of the second program operation on the selected word line of the second memory block.

19. The method of claim 17, further comprising performing a dummy page buffer initialization operation on the selected word line of the second memory block between the performing of the first program operation on the selected word line of the second memory block and the performing of the second program operation on the selected word line of the second memory block.

20. The method of claim 17, wherein the selected word line of the first memory block and the selected word line of the second memory block are on a same level with respect to a substrate.

* * * * *